(12) United States Patent  
Axmon et al.

(10) Patent No.: US 10,784,972 B2
(45) Date of Patent: Sep. 22, 2020

(54) REDUCED GRID FOR MEASUREMENT OF TOTAL RADIATED POWER

(71) Applicant: Telefonaktiebolaget LM Ericsson (publ), Stockholm (SE)

(72) Inventors: Joakim Axmon, Limhamn (SE); Thomas Chapman, Solna (SE); Torbjörn Elfström, Fjärås (SE); Esther Sienkiewicz, Ottawa (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/336,554

(22) PCT Filed: Aug. 16, 2017

(86) PCT No.: PCT/EP2017/070744
§ 371 (c)(1),
(2) Date: Mar. 26, 2019

(87) PCT Pub. No.: WO2018/059821
PCT Pub. Date: Apr. 5, 2018

(65) Prior Publication Data
US 2019/0229817 A1 Jul. 25, 2019

Related U.S. Application Data

(60) Provisional application No. 62/402,944, filed on Sep. 30, 2016.

(51) Int. Cl.
*H04B 17/10* (2015.01)
*G01R 29/10* (2006.01)
(Continued)

(52) U.S. Cl.
CPC ........... *H04B 17/102* (2015.01); *G01R 29/10* (2013.01); *H04B 7/0691* (2013.01); *H04B 7/0874* (2013.01)

(58) Field of Classification Search
CPC .. H04B 17/102; H04B 7/0691; H04B 7/0874; G01R 29/10
See application file for complete search history.

(56) References Cited

U.S. PATENT DOCUMENTS 9,041,610 B1 5/2015 Henrie
2010/0207827 A1* 8/2010 Oh .................. G01R 29/10
343/703

(Continued)

OTHER PUBLICATIONS

Jankowski-Mihulowicz et al., "The Idea of Enhancing Directional Energy Radiation by a Phased Antenna Array in UHF RFID System," International Journal of Electronics and Telecommunications, vol. 62, No. 2, Jun. 1, 2016, pp. 115-120, ResearchGate.

(Continued)

*Primary Examiner* — Nguyen T Vo
(74) *Attorney, Agent, or Firm* — Coats & Bennett, PLLC

(57) ABSTRACT

A method and apparatus for performing TRP measurements of an antenna system uses a sampling grid that takes into account the spherical geometry and the directivity of the antenna under test, while considering test time. The optimization of the sampling grid balances the trade-off between reducing the number of samples to reduce test time, and ensuring accuracy of the TRP estimates.

21 Claims, 20 Drawing Sheets

(51) Int. Cl.
*H04B 7/06* (2006.01)
*H04B 7/08* (2006.01)

(56) References Cited

U.S. PATENT DOCUMENTS

| | | | |
|---|---|---|---|
| 2013/0059545 | A1 | 3/2013 | Kyoesti et al. |
| 2013/0187914 | A1* | 7/2013 | Kozlov .................. G06T 17/05 345/420 |
| 2013/0300616 | A1* | 11/2013 | Reed ...................... G01R 29/10 343/703 |
| 2014/0091961 | A1* | 4/2014 | Foegelle ................ G01R 29/10 342/1 |
| 2018/0027434 | A1* | 1/2018 | Foegelle .............. H04B 7/0617 455/67.13 |

OTHER PUBLICATIONS

Ericsson, "On spatial ACLR requirement and testing aspects", TSG-RAN Working Group 4 (Radio) meeting #80bis, Ljubljana, Slovenia, Oct. 10, 2016, pp. 1-4, R4-168299, 3GPP.

CATT, "Discussion on measurement grid", 3GPP TSG-RAN WG4 Meeting #82bis, Spokane, US, Apr. 3, 2017, pp. 1-11, R4-1703038, 3GPP.

Ericsson, "Proposal on how to restrict measurement directions for TRP estimation of a wanted carrier", 3GPP TSG-RAN WG4 #81, Reno, Nevada, US, Nov. 14, 2016, pp. 1-3, R4-1609981, 3GPP.

Ericsson, "On TRP sampling grid for spatial ACLR", TSG-RAN Working Group 4 (Radio) meeting #80bis, Ljubljana, Slovenia, Oct. 10, 2016, pp. 1-4, R4-168304, 3GPP.

Ericsson, "Further elaboration on practical measurement Grids for ACLR and unwanted emissions", 3GPP TSG-RAN WG4 #81, Reno, Nevada, US, Nov. 14, 2016, pp. 1-4, R4-1609979, 3GPP.

Ericsson, "Spurious emissions measurement grid", 3GPP TSG-RAN WG4 #81, Reno, Nevada, US, Nov. 14, 2016, pp. 1-4, R4-1609982, 3GPP.

Ericsson, "Measuring unwanted emission total radiated power", TSG-RAN Working Group 4 (Radio) meeting #80, Gothenburg, Sweden, Aug. 22, 2016, pp. 1-4, R4-165783, 3GPP.

Ericsson, "WF on clarification of open technical questions on AAS", TSG-RAN 4 #80, Agenda item 8.12.1, submitted for approval Aug. 25, 2016, pp. 1-5, 3GPP.

Nokia, "On power sampling grid for OTA ACLR and in-band unwanted emissions", TSG-RAN Working Group 4 (Radio) meeting #81, Reno, Nevada, USA, Nov. 14, 2016, pp. 1-10, R4-1610501, 3GPP.

* cited by examiner

A　　　　　　　　　　　　　B

C

B

A

REDUCED GRID FOR MEASUREMENT OF TOTAL RADIATED POWER

TECHNICAL FIELD

The present disclosure relates generally to measurements of the radiated power of an antenna system and, more particularly, to methods and apparatus for measuring radiated power of an antenna system using reduced sampling grids.

BACKGROUND

Total radiated power, or TRP for short, is an active measurement that is used for determining the total power transmitted by an antenna or antenna system when connected to an active transmitter. One approach to measuring TRP is that measurements of radiated power, such as equivalent isotropic radiated power (EIRP) measurements, are carried out at multiple sampling points over a sphere surrounding the device under test (DUT), also known as equipment under test (DUT). A straightforward approach for estimating TRP is to make EIRP measurements at uniform intervals over the sphere. The error arising from this approach is related to the interval between EIRP measurements (and hence the number of EIRP measurements)

Current discussions about over-the-air (OTA) requirements in 3GPP consider defining TRP measurements also for in band and spurious unwanted emissions, e.g., neighboring channel emissions. This would require a TRP measurement over a large number of frequencies, and potentially with non-omnidirectional radiation patterns.

Today's well known and accepted method for calculating TRP is based on measuring EIRP for θn and φm on the surface of the unit sphere at angular intervals of Δθn and Δφm thereby allowing for equi-angle method sampling. A coarse sampling interval works well for measuring devices that are not creating beam patterns but rather omnidirectional patterns, such as user equipment (UEs). It is also well suited for measuring wanted carrier TRP. However, measuring TRP of spurious emissions across the whole frequency domain around the whole sphere could lead to a large amount of measurement time. For example, at a one-degree granularity the full sphere would give rise to 64,800 (180× 360) samples for just one frequency. Since the amount of test frequencies cannot be reduced, the inventors propose to reduce the granularity to provide a coarser grid which will thereby decrease the large number of samples and associated test time. This method has some challenges since just providing the coarser grid can reduce the accuracy of the overall TRP value. For beam patterns that are not omnidirectional and have a relatively narrow half power beam width this can prove even more of an issue. For example, if samples do not accurately capture the main beam power (or over capture) this can cause an over- (or under-) estimation of the TRP value significantly.

Hence, there is a need for a method that provides a balance between measurement effort and measurement performance.

SUMMARY

A method and apparatus for performing TRP measurements of an antenna system uses a reduced sampling grid that takes into account the spherical geometry and the directivity of the antenna under test, while considering test time. The optimization of the sampling grid balances the trade off between reducing the number of samples to reduce test time, and ensuring accuracy of the TRP estimates.

A measurement setup would consist of a base station under test, test and control hardware and software for the base station and measurement system and test equipment. Embodiments of the disclosure relate to the test and control hardware used for controlling the base station and the test environment.

The set of points at which measurements are to be conducted can be reduced to up to 50% of those in prior art methods. The TRP measurement thus can be executed quicker than before, which leads to cost savings and increased capacity of constrained resources such as anechoic chambers.

Exemplary embodiments of the disclosure comprise methods for making over-the-air measurements of an antenna system. In one embodiment, the method comprises: defining at least one spatial sampling grid around the antenna system, said sampling grid having a distribution of sampling points that varies as a function of a geometry of the antenna system and/or a beam pattern of the antenna system, and measuring a received power at selected ones of said sampling points of said spatial sampling grid.

Other embodiments of the disclosure comprise measurement equipment for making over-the-air measurements of radiated power emitted by a directional antenna system. One embodiment of the measurement equipment comprises a test antenna to receive test signals transmitted by said directional antenna system, a measurement circuit to measure received power of said test signals received by said test antenna, a positioner for changing the relative positions of the directional antenna system and the test antenna; and a control circuit. The control circuit is configured to: define a spatial sampling grid around the directional antenna system, said sampling grid having a distribution of sampling points that varies as a function of a geometry and/or a wanted coverage of the directional antenna system; control the positioner to position the test antenna relative to the directional antenna system at sampling points in said spatial sampling grid; and control the measurement circuit to measure received power at sampling points in said spatial sampling grid.

DETAILED DESCRIPTION

TRP is an active measurement that is used for determining the total power transmitted by an antenna or antenna system when connected to an active transmitter. Measurements are carried out at multiple positions over a sphere around the DUT (e.g., a directional antenna system).

Figure 1:
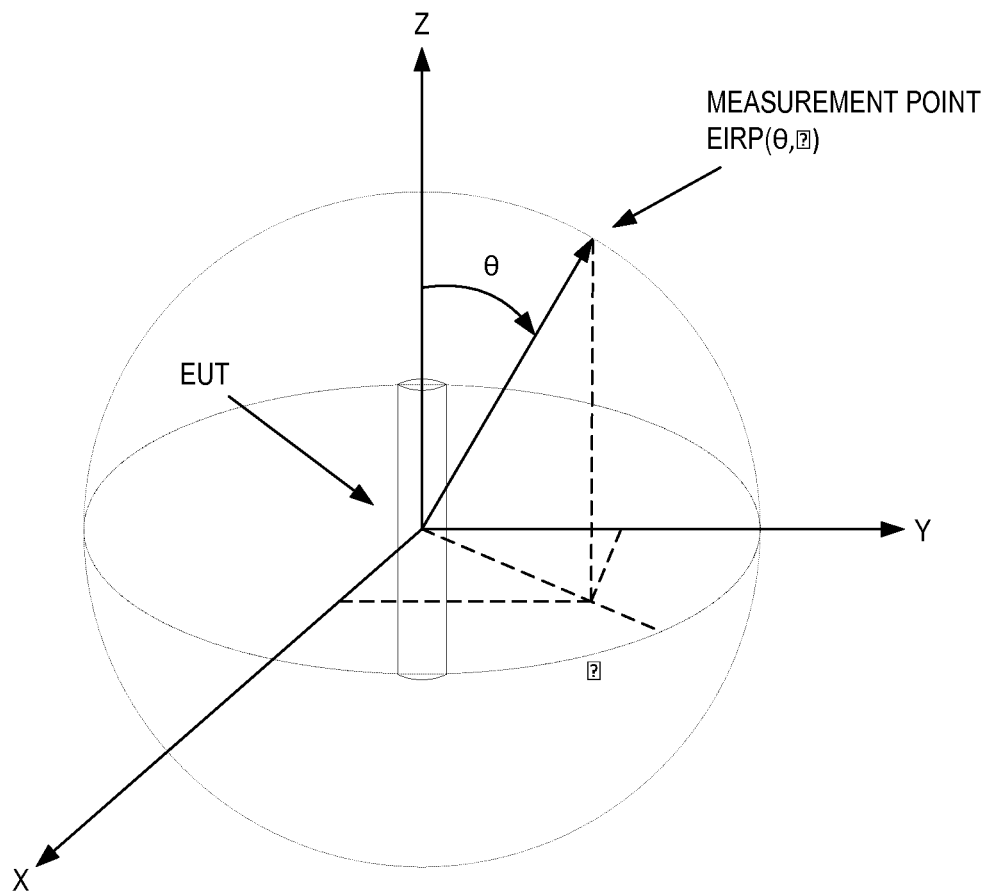
FIG. 1 illustrates a DUT and a coordinate system for TRP measurements.

FIG. 1 illustrates a spherical coordinate system for making TRP measurements. The angle $\theta$, referred to herein as the elevation angle, is defined within the interval $0<\theta<\pi$, and $\varphi$ angle, referred to as the azimuth angle, is defined within the interval $0<\varphi<2\pi$. The direction $(\theta, \varphi)=(\pi/2, 0)$ is the direction along the x-axis. Theoretically the TRP is derived by integrating the EIRP over the surface of a sphere:

$$TRP = \frac{1}{4\pi} \int_0^{2\pi} \int_0^{\pi} EIRP(\theta, \varphi) \sin\theta d\theta d\varphi \qquad \text{Eq. (1)}$$

where $\theta$ is the elevation angle and $\varphi$ is the azimuth angle. In practice, the integral over the surface of a sphere is approximated by the summation below, where it is assumed that the measurements are carried out equidistantly with respect to $\theta$ and $\varphi$.

$$TRP \approx \frac{\pi}{2NM} \sum_{n=0}^{N-1} \sum_{m=0}^{M-1} EIRP(\theta_n, \varphi_m) \sin\theta_n. \qquad \text{Eq. (2)}$$

where $\theta$ is the elevation, $\varphi$ is the azimuth. The finer the grid of $\theta$ and $\varphi$, the better will be the approximation of the summation to the integral.

Figure 2:
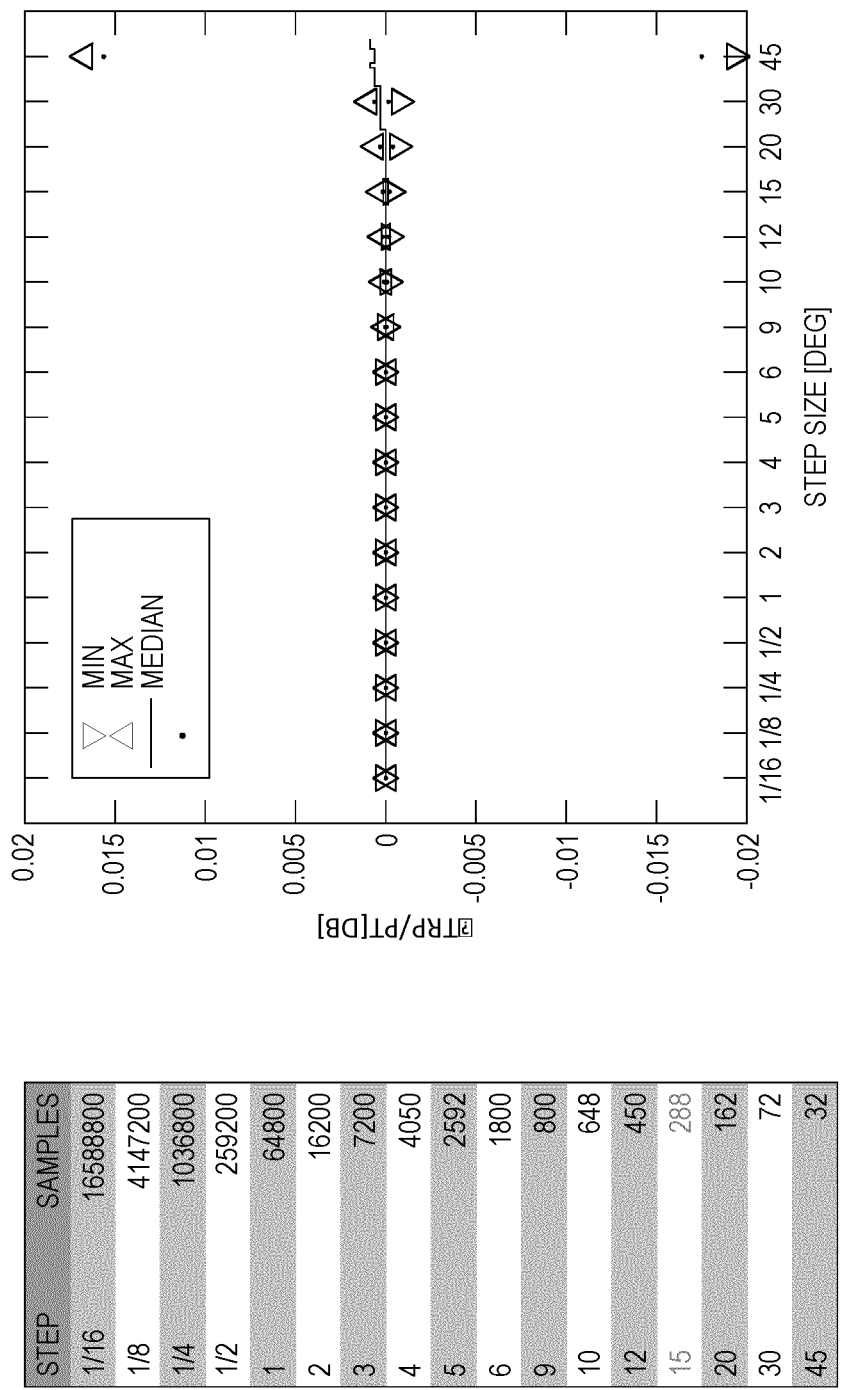
FIG. 2 is a graph illustrating accuracy of TRP measurements made using a uniform grid.

FIG. 2 illustrates accuracy of TRP measurements made using a uniform grid. with $\theta$ and $\varphi$ ranging from 1/16th degree to 45 degrees and distribution with respect to sensitivity of starting position of $\theta$ and $\varphi$. The beam measured is a Gaussian beam with 65 degrees 3 dB BW, as specified in 3GPP TR 37.842 V1.9.0, clause 5.3.3.1. As shown in FIG. 2, it is not always necessary to use a dense grid in order to accurately estimate the TRP. TRP measurements in this manner have predominantly been used for measuring mobile equipment, such as mobile phones, with omnidirectional antennas.

Figure 3B:
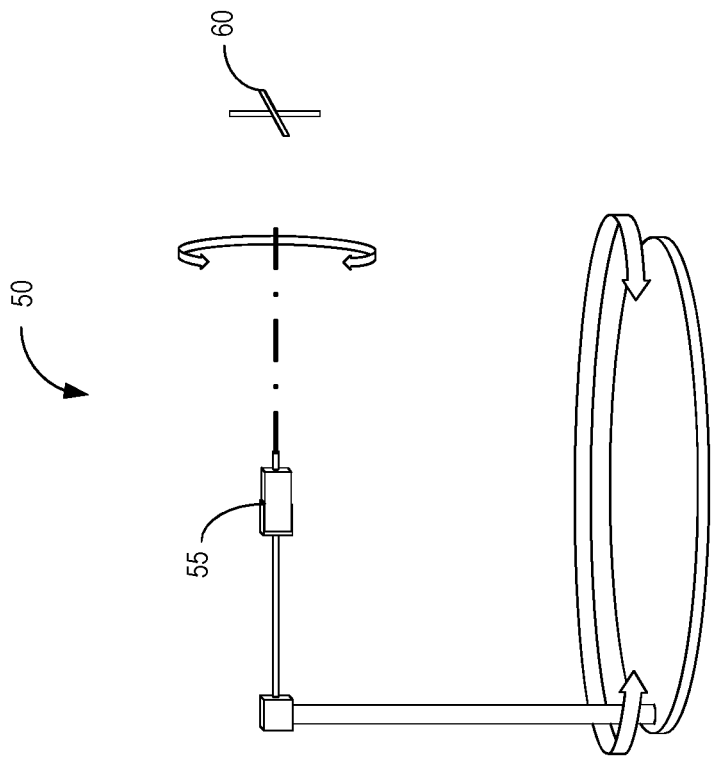
FIGS. 3A and 3B illustrate TRP measurement systems with a distributed axis and a combined axis respectively.
Figure 3A:
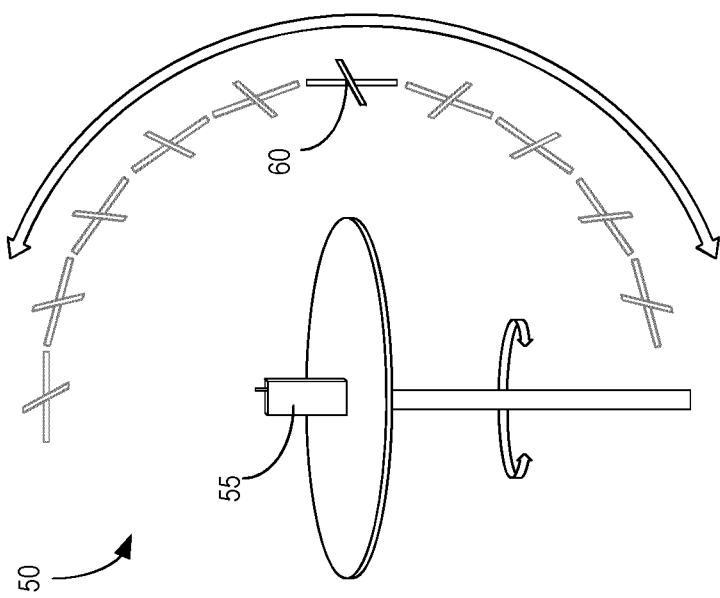

FIGS. 3A and 3B illustrate two well-known test setups 50 used to perform TRP measurements. To measure EIRP at each sampling point on the surface of the sphere, a spherical positioning system is needed to move either the DUT 55 (e.g., directional antenna system) and/or the test antenna 60. FIG. 3A illustrates a distributed axis test setup 50 where the DUT 55 is rotated about a first axis and the test antenna 60 is rotated about a second axis. FIG. 3B illustrates a combined axis test setup 50 wherein the DUT 55 is rotated about two axes and the test antenna 60 is fixed. As described in more detail below, the measurements may be performed in an anechoic chamber.

Figure 4:
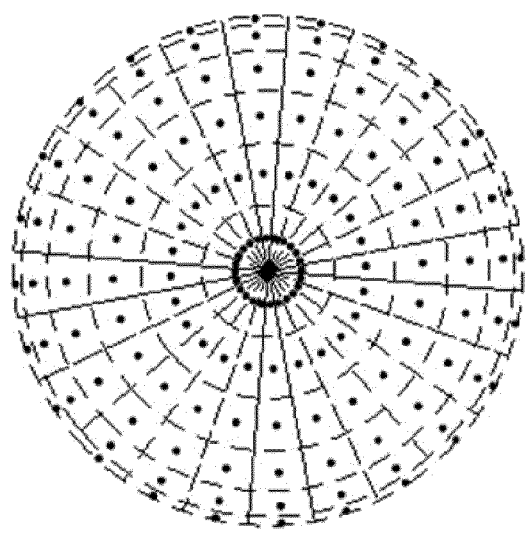
FIGS. 4A and 4B illustrate a projection of sampling points onto the azimuth plane for an equal distance and equal area measurement approaches.
Figure 4:
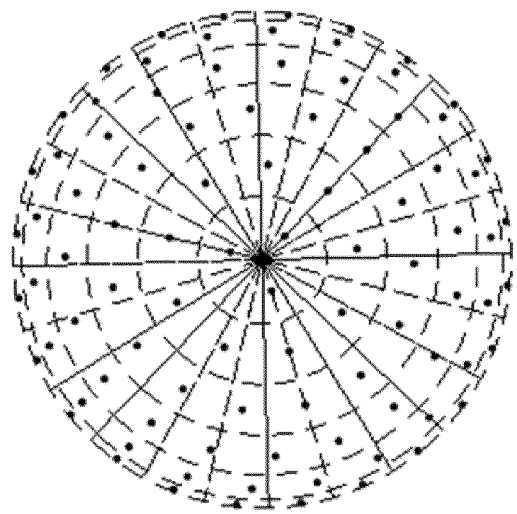

As specified in Cellular Telecommunications and Internet Association (CTIA), "Test Plan for Mobile Station Over-the-air Performance", rev 3.1, section 2.6, the number of measured points can be reduced by targeting equal area per sampling point rather than equal distance between points. FIGS. 4A and 4B illustrate a projection of sampling points onto the azimuth plane for the equal distance and equal area approaches. FIG. 4A shows an equidistant sampling grid in $\Delta\theta$ and $\Delta\varphi$. FIG. 4B shows equidistant grid in $\Delta\theta$ and $\theta$-dependent $\Delta\varphi$. As shown in FIG. 4A, with equal distance between sampling points in $\varphi$, the measurements will be denser the further to the extremes of $\theta$ they are carried out. As shown in FIG. 4B, the distance in $\varphi$ may be increased when close to the extremes of $\theta$ so that the sampling points cover more equal areas. For mobile phones, TRP is typically measured for the wanted carrier, and it is assumed that the mobile phone will have a reasonably omnidirectional radiation pattern.

FIGS. 5A-5D illustrate four kinds of reference measurement sampling grids used to perform over-the-air measurements.

Figure 5:
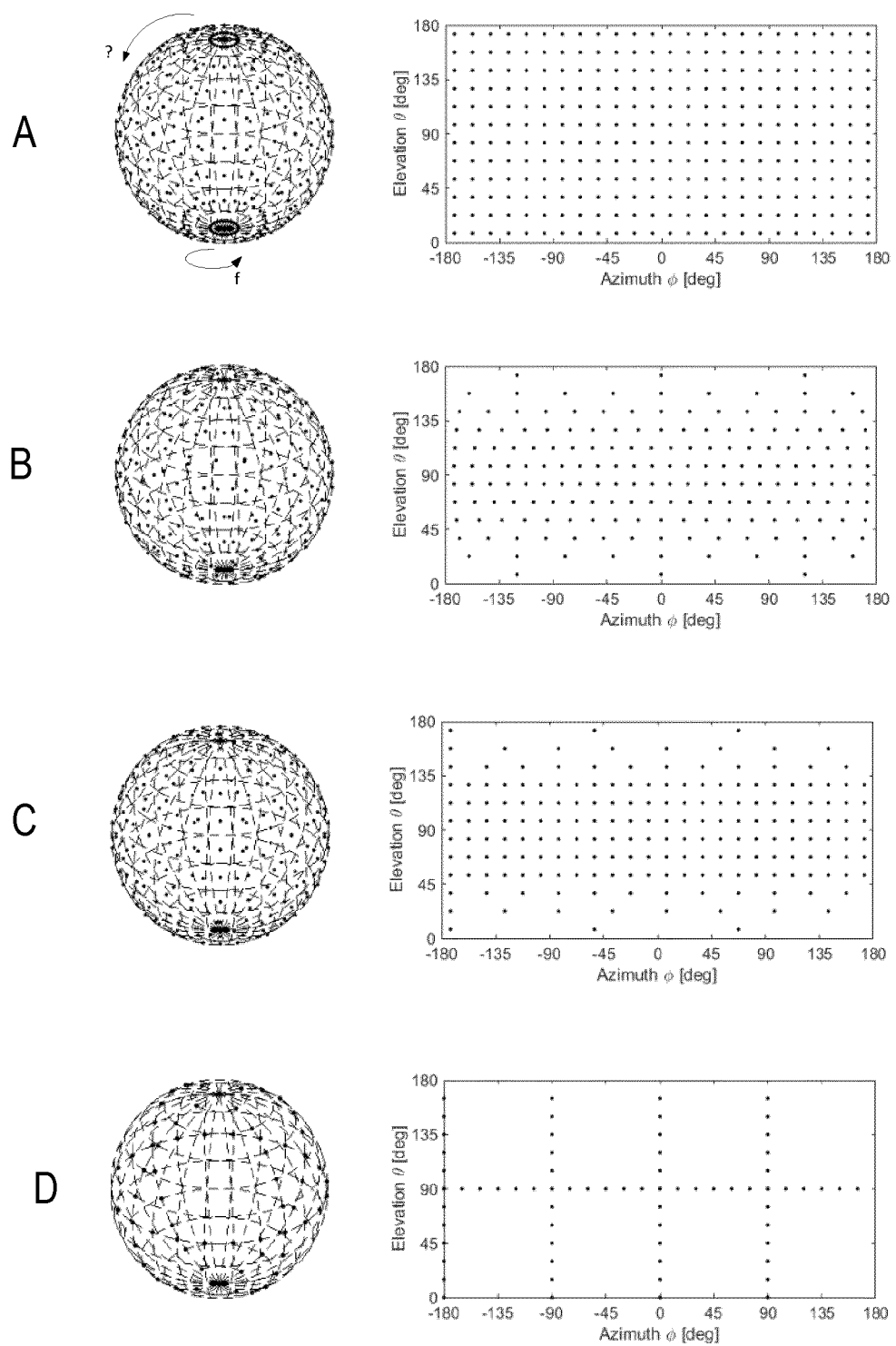
FIGS. 5A -5D illustrate full sampling grids.
Figure 6:
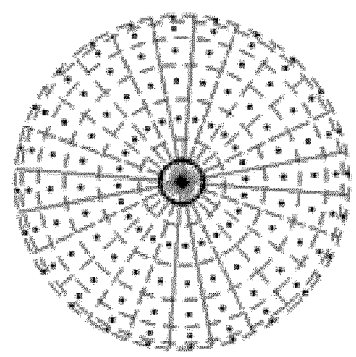
FIGS. 6A-6D show the measurements grids of FIGS. 5A-5D respectively projected unto the azimuth plane.
Figure 6:
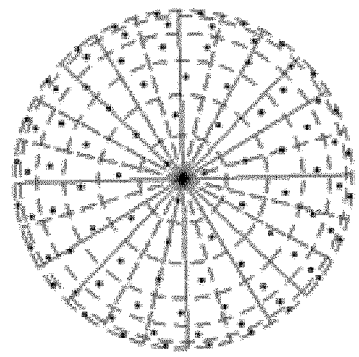
Figure 6:
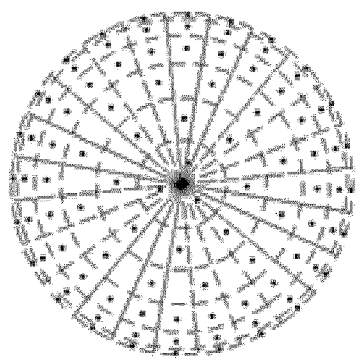
Figure 6:
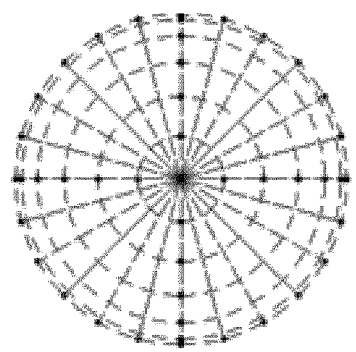

FIG. 5A illustrates the equidistant sampling grid with $\Delta\varphi=15$ and $\Delta\theta=15$ degrees. Note the concentration of sampling points around $\theta=0$ and $\theta=180$ degrees.

FIG. 5B illustrates a sampling grid that is equidistant in elevation with $\Delta\theta=15$ degrees, and elevation-dependent step size for $\varphi$, with $\Delta\varphi=15$ for $\theta=90$ degrees and then gradually increasing towards any of the extremes of $\theta$, under the constraint of being evenly distributed in the azimuth plane. Note that the sampling points are evenly distributed over the surface of the sphere, i.e., each sampling point is representing approximately the same area.

FIG. 5C illustrates a sampling grid that is equidistant in elevation with $\Delta\theta=15$ degrees, and elevation-dependent step size for $\varphi$, with $\Delta\varphi=15$ for $\theta=90$ degrees and gradually increasing towards any of the extremes of $\theta$, under the constraint that each sampling point shall be at an azimuth that coincides with a sampling point at elevation $\theta=90$ degrees. Such a constraint may be imposed by the setup of the measurement equipment. Note that the sampling points are more evenly distributed over the surface of the sphere, i.e., each sampling point is representing approximately the same area.

FIG. 5D illustrates an orthogonal axis sampling grid with $\Delta\varphi=15$ and $\Delta\theta=15$ degrees. The orthogonal axis sampling grid is a simplified sampling methodology based on the approach where the TRP is measured in three planes and then averaged. The TRP is given by $$TRP \approx \frac{1}{3}(EIRP_{xy} + EIRP_{xz} + EIRP_{yz}) \qquad \text{Eq. (3)}$$

Where $EIRP_{xy}+EIRP_{xz}+EIRP_{yz}$ represent the EIRP in the xy, xz, and yz planes respectively. In Equation 3, $EIRP_{xy}+EIRP_{xz}+EIRP_{yz}$ are equally weighted. In other embodiments, the EIRP values can be weighted differently. The EIRP in the xy, xz, and yz planes respectively are given by $$EIRP_{xy} = \frac{1}{N_\varphi} \sum_{k=1}^{N_\varphi} EIRP\left(\frac{\pi}{2}, \varphi_k\right), \quad \text{Eq. (4)}$$

$$EIRP_{xz} = \frac{1}{2N_\theta} \sum_{l=1}^{N_\theta+1} (EIRP(\theta_l, 0) + EIRP(\theta_{N_\theta-l+2}, \pi)), \quad \text{Eq. (5)}$$

and $$EIRP_{yz} = \frac{1}{2N_\theta} \sum_{l=1}^{N_\theta+1} \left(EIRP\left(\theta_l, \frac{\pi}{2}\right) + EIRP\left(\theta_{N_\theta-l+2}, \frac{3\pi}{2}\right)\right). \quad \text{Eq. (6)}$$

As can be seen in FIG. 5D, the orthogonal axis sampling grid pattern is considerably sparser than any of the other three patterns and, hence, allows measurements to be carried out quicker. Although this method provides an efficient means of producing a TRP estimate, the value can be highly overestimated or underestimated if the main lobe is not captured in one of the three orthogonal cuts due to beam steering. A similar problem arises for estimating narrow beam width patterns as expressed with the coarse uniform grid sampling method. This approach may be suitable, for example, when measuring spurious emissions.

FIGS. 6A-6D illustrate projections of the patterns in FIGS. 5A-5D onto the azimuth plane.

The deviations from ideal TRP as acquired using an equidistant sampling grid with $\Delta\theta=1/16$ and $\Delta\varphi=1/16$ degree, by the prior art methods with $\Delta\theta$ in the range of 1 to 15 degrees, and $\Delta\varphi$ in the range of 1 to 15 degrees at least for elevation $\theta=90$ degrees, are shown in FIGS. 7A-7D for the sampling grids in FIGS. 5A 5D. The beam is a Gaussian beam with 65 degrees 3 dB bandwidth as specified in 3GPP TR 37.842 V1.9.0, clause 5.3.3.1. The distribution is with respect to an uncertainty of 5 degrees in $\theta$ and $\varphi$ with respect to where the first sampling point is taken, i.e., the simulations account for a misalignment of up to 5 degrees in the measurement setup.

Figure 7:
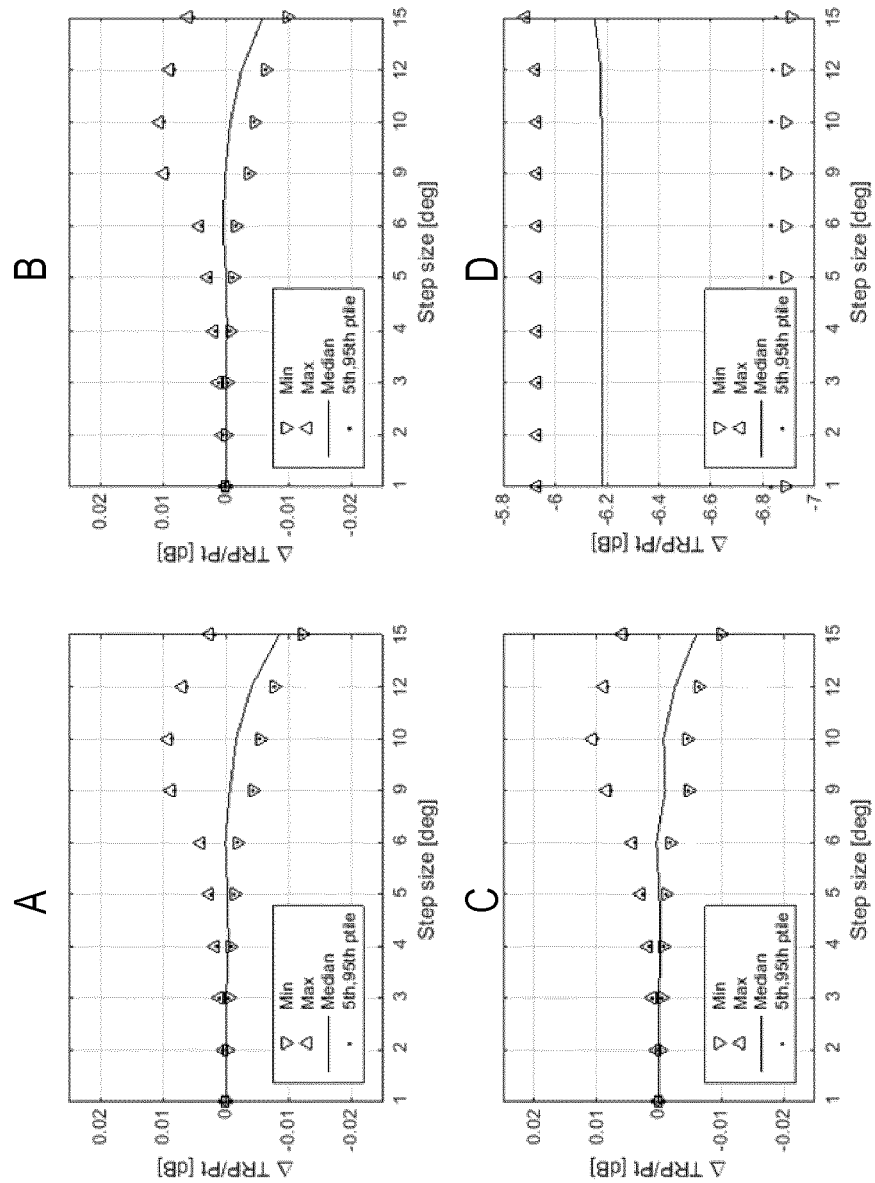
FIGS. 7A-7D are graphs showing deviations from ideal results for the measurements grids of FIGS. 5A-5D respectively.

As evident from FIG. 7D, the orthogonal axis sampling method deviates significantly from the ideal TRP, whereas FIGS. 7A-7C indicate a consistent performance with modest deviation from the ideal TRP.

In exemplary embodiments of the disclosure, knowledge about the geometry and/or radiation pattern of the antenna under test is used to reduce test time while ensuring accuracy of the TRP estimates. The radiation pattern typically comprises an expected or predicted radiation pattern. For example, the manufacturer may declare an expected radiation pattern or beam pattern. A spatial sampling grid is defined around the antenna system or DUT. The positions of the sampling points in the spatial sampling grid may be constrained based on limitations imposed by the measuring equipment. The distribution of sampling points in the spatial sampling grid varies based on a geometry of the antenna system and/or an expected/predicted radiation pattern of the antenna system. In some embodiments, the spatial sampling grid around said directional antenna system is divided into two or more sampling zones based on the antenna geometry and/or radiation pattern, and the distribution of sampling points varies in different ones of said sampling zones. For example, the sampling grid may be divided into front and back sampling zones for measuring front and back radiation respectively. The back sector may have a sparser distribution of sampling points than the front sector. As another example, the first sampling zone of the sampling grid is defined as a surface of a spherical cap or a spherical sector. The first sampling zone has a specified sampling grid density enabling a denser or sparser grid at a narrow beam of the directional antenna system.

In some embodiments, the grid may be divided into more than two sampling zones. Using knowledge of the geometry and/or radiation pattern allows the number of sampling points to be reduced in measurement areas where coarse measurement is sufficient, while sampling with higher resolution in more critical measurement areas.

As one example, antennas used for AAS typically have very low radiation in the back (e.g., about 25-30 dB front to back ratio). Hence, grids of different density may be used for measuring the front and the back of the AAS. Measuring the back of the AAS could even be reduced further by not having a grid but one constant value, such as −30 dB as used for a typical front to back ratio for a base station antenna. The grid density can also be changed based on directional properties of the signal of interest that is under measurement. For example, in case of measuring a narrow beam, a fine grid would be needed, whilst a broad beam would need only a coarse grid. The grid pattern can vary between the area covered by the beam and the area outside the coverage area of the beam. That is, a relatively denser grid may be used in the coverage area of the beam and a relatively coarser gird may be used outside the coverage area of the beam.

The grid can also vary depending on the frequency of interest. For example, frequencies where spurious emissions are measured (i.e. frequencies far away from the center of the carrier/wanted signal) the grid density may be relaxed since it's expected that the signals will become less correlated (more omnidirectional) and therefore less important to have a dense grid to approximate TRP. It is also possible to have a less accurate TRP estimate at these frequencies.

In some embodiments, further reductions in the number of measurements can be achieved by measuring received power at sampling points in a first one of said sampling zones, and substituting a constant value for measurements over a second sampling zone. In some embodiments, the constant value is determined based on a sensitivity limit of measurement equipment used to perform said measurements. In other embodiments, the constant value is determined based on measurements in said first sector of said sampling grid and a front-to-back ratio relating measurements in said first sector to an expected received power in said second sector.

In some embodiments, the azimuth step sizes between sampling points in the sampling grid are dependent on the elevation of the sampling points. In one embodiment, the azimuth positions of the sampling points in the spatial sampling gird are constrained to multiples of a predetermined azimuth step size.

In some embodiments, the sampling grid density is increased at a location of the main beam emitted from the directional antenna system when measuring TRP of unwanted emissions close to the main carrier.

In one embodiment, the first sampling zone of the sampling grid is defined as a spherical cap or spherical sector. The first sampling zone has a specified sampling grid density enabling a denser or sparser grid depending of the direction and beam width of a narrow beam of the directional antenna system.

In some embodiments, first and second sampling grids are defined, wherein the sampling points in at least one of the first and second sampling grids varies as a function of a geometry of the antenna system and/or a radiation pattern of the antenna system. In one embodiment, the first sampling grid is adapted for measuring total radiated power of a desired signal and the second sampling grid is adapted to measure total radiated power of spurious or unwanted emission signals. In another embodiment, the first sampling grid is adapted for measuring total radiated power of a desired signal and the second sampling grid is adapted to measure total radiated power. In still another embodiment, the first sampling grid is adapted for measuring total radiated power of a desired signal and the second sampling grid is adapted to measure total radiated power of unwanted emissions on a neighbor frequency. The total radiated power of the desired signal and the total radiated power of the neighbor emissions can be used to calculate ACLR.

Figure 8:
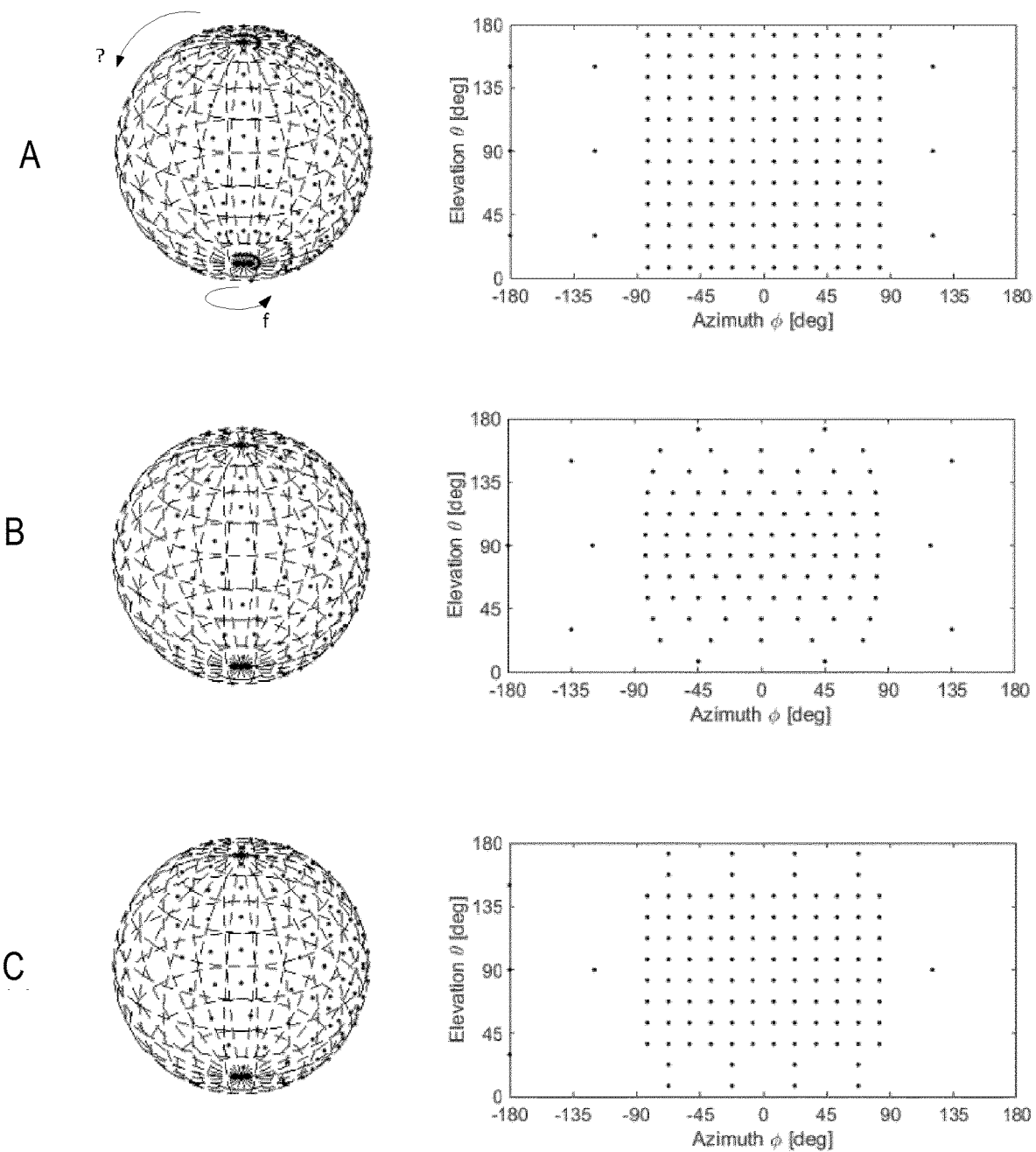
FIGS. 8A-8C illustrate reduced sampling grids having two measurements sectors.

Three examples of reduced sampling grids are illustrated in FIGS. 8A-8C.

FIG. 8A illustrates an equidistant sampling grid divided into front and back sections. In the front section, $\Delta\varphi=15$ degrees and $\Delta\theta=15$ degrees. In the back section $\Delta\varphi=60$ degrees and $\Delta\theta=60$ degrees.

FIG. 8B illustrates a sampling grid divided into front and back sections where the sampling points in each section are equidistant in elevation and vary with azimuth. In the front section, $\Delta\theta=15$ degrees, and $\Delta\varphi$ is elevation dependent, with $\Delta\varphi=15$ at $\theta=90$ degrees and then gradually increasing towards the extremes of $\theta$. In the back section, $\Delta\theta=60$ degrees, and $\Delta\varphi$ is elevation dependent, with $\Delta\varphi=60$ at $\theta=90$ degrees and then gradually increasing towards the extremes of $\theta$. In this embodiment, the sampling points at a given elevation in each section are constrained to being evenly distributed in the respective section of the azimuth plane.

FIG. 8C illustrates a sampling grid divided into front and back sections where the sampling points in each section are equidistant in elevation and vary with azimuth. In the front section, $\Delta\theta=15$ degrees, and $\Delta\varphi$ is elevation dependent, with $\Delta\varphi=15$ at $\theta=90$ degrees and then gradually increasing towards the extremes of $\theta$. In the back section, $\Delta\theta=60$ degrees, and $\Delta\varphi$ is elevation dependent, with $\Delta\varphi=60$ at $\theta=90$ degrees and then gradually increasing towards the extremes of $\theta$. In this embodiment, the sampling points at a given elevation in each section are constrained that each sampling point shall be at an azimuth that aligns with a sampling point at elevation $\theta=90$ degrees.

Figure 9:
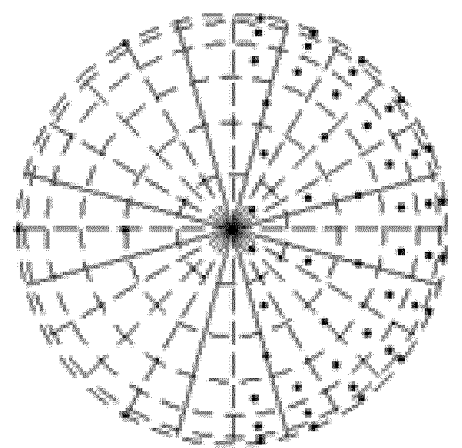
FIGS. 9A-9C show the sampling grids of FIGS. 8A-8C respectively projected unto the azimuth plane.
Figure 9:
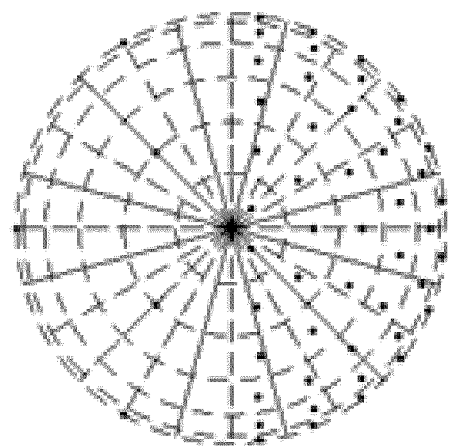
Figure 9:
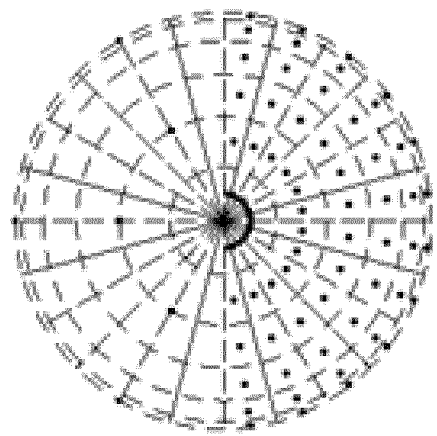

FIGS. 9A-9C illustrate projections of the patterns in FIGS. 8A-8C onto the azimuth plane.

Figure 10:
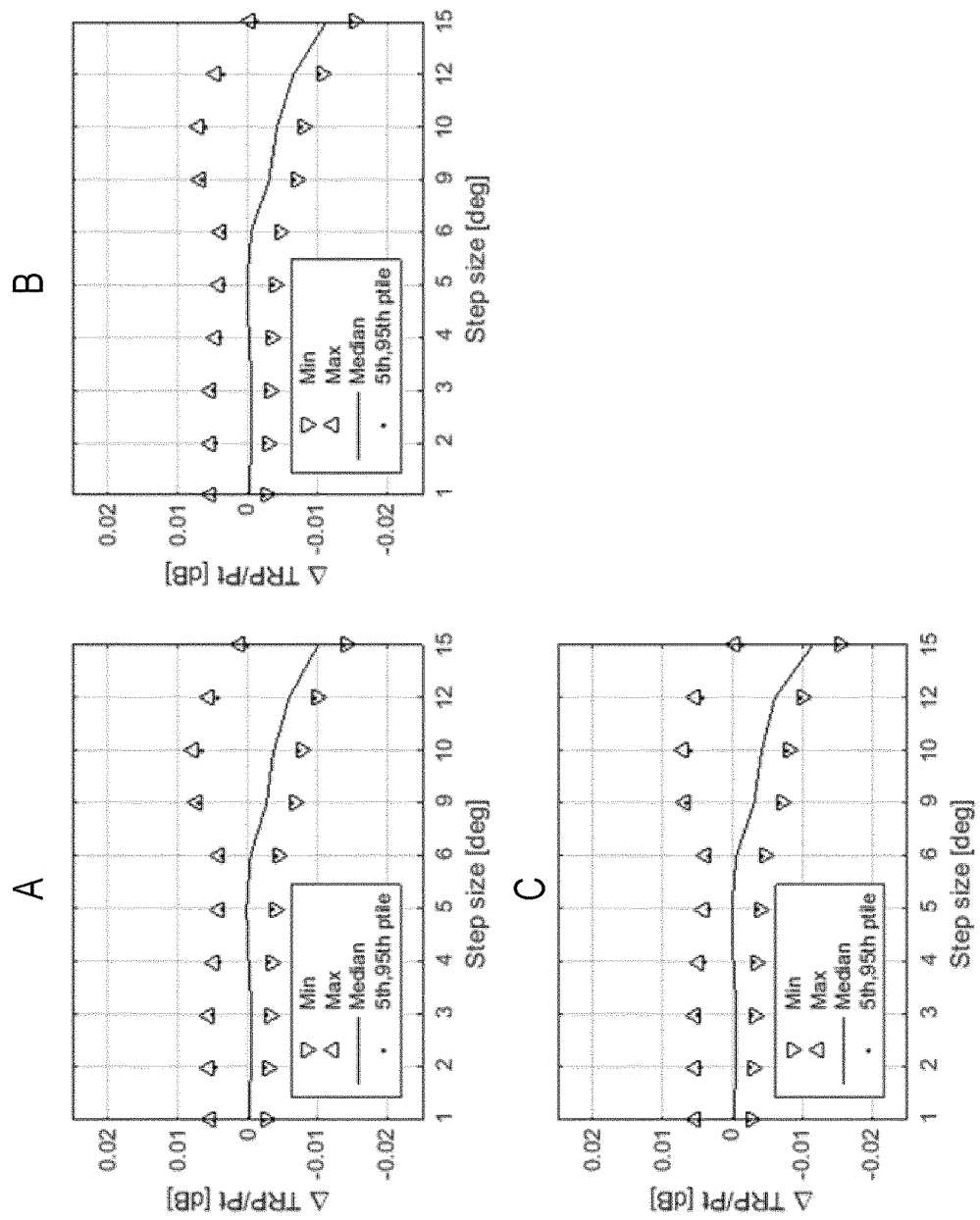
FIGS. 10A -10C are graphs showing deviation from ideal results for the sampling grids of FIGS. 8A-8C respectively.

The deviations from ideal TRP as acquired using an equidistant sampling grid with $\Delta\theta=\frac{1}{16}$ and $\Delta\varphi\frac{1}{16}$ degree, by the methods outlined above with $\Delta\theta$ in the range of 1 to 15 degrees, and $\Delta\varphi$ in the range of 1 to 15 degrees at least for elevation $\theta=90$ degrees, are shown in FIGS. 10A-10C for the sampling grids in FIGS. 8A-8C. The beam is a Gaussian beam with 65 degrees 3 dB bandwidth as specified in 3GPP TR 37.842 V1.9.0, clause 5.3.3.1, i.e., the same as used for the prior art methods above. The distribution is with respect to an uncertainty of 5 degrees in $\theta$ and $\varphi$ with respect to where the first sampling point is taken, i.e., the simulations account for a misalignment of up to 5 degrees in the measurement setup.

A comparison between FIGS. 10A-10C with FIGS. 7A-7C indicate that there is an insignificant loss of accuracy when using a sparser grid at the back of the antenna. As shown in Table 1, the sparser grid leads to a reduction of sampling points by 53%, more or less reducing the measurement time to half of that in prior art.

TABLE 1

Comparison of number of measured points in prior art (full grid) and reduced grid (dual grid)

|  | Uniform (a) | Equal area I (b) | Equal area II (c) |
|---|---|---|---|
| Full Grid | 288 | 188 | 192 |
| Reduced grid | 153 | 101 | 117 |
| Ratio | 53% | 54% | 61% |

The creation of reduced sampling grids is described below for exemplary embodiments. When using a reduced sampling grid, TRP is estimated according to:

$$TRP \approx \frac{1}{\sum_n A_n} \sum_n A_n(EIRP_\phi(\phi_n, \theta_n) + EIRP_\theta(\phi_n, \theta_n)) \quad \text{Eq. (7)}$$

where $A_n$ represents the area associated with the $n^{th}$ sampling point (also referred to as a measurement point), r is the constant radius,
$\theta$ is the elevation angle, and $\phi$ is the azimuth angle.

$$A_n = r^2 \Delta_{\phi_n} \left| \sin\left(\theta_n + \frac{1}{2}\Delta_{\theta_n}\right) - \sin\left(\theta_n - \frac{1}{2}\Delta_{\theta_n}\right) \right|. \quad \text{Eq. (8)}$$

First Embodiment

In a first embodiment, shown in FIG. 8A, the sampling points of the sampling grid are determined by dividing the azimuth plane into a first and a second sector, each with an angular span of $\Psi$ and $2\pi-\Psi$ respectively. An elevation step size of $\Delta_\theta^{(1)}$ fulfilling $$\frac{\pi}{\Delta_\theta^{(1)}} \in N$$

is used in the first sector, and an elevation step size of $\Delta_\theta^{(2)}$ fulfilling $$\frac{\pi}{\Delta_\theta^{(2)}} \in N$$

in the second sector. The elevation grid points in the first sector are defined by the set $$S_\theta^{(1)} = \left\{ \frac{k+1}{2}\Delta_\theta^{(1)}, k = 0, 1, \ldots, (\pi/\Delta_\theta^{(1)} - 1) \right\}, \quad \text{Eq. (9)}$$

and in the second sector, by the set $$S_\theta^{(2)} = \left\{ \frac{k+1}{2}\Delta_\theta^{(2)}, k = 0, 1, \ldots, (\pi/\Delta_\theta^{(2)} - 1) \right\}. \quad \text{Eq. (10)}$$

An azimuth step size of $\Delta_\phi^{(1)}$ fulfilling $\Psi/\Delta_\phi^{(1)} \in N$ in the first sector, and $\Delta_\phi^{(2)}$ fulfilling $(2\pi-\Psi)/\Delta_\phi^{(2)} \in N$ in the second sector, may be used. The azimuth grid points in the first sector are defined by the set $$S_\phi^{(1)} = \left\{ \frac{k+1}{2} \Delta_\phi^{(1)}, k = 0, 1, \ldots, (\Psi/\Delta_\phi^{(1)} - 1) \right\}, \quad \text{Eq. (11)}$$

and in the second sector, by the set $$S_\phi^{(2)} = \left\{ \frac{k+1}{2} \Delta_\phi^{(2)}, k = 0, 1, \ldots, ((2\pi - \Psi)/\Delta_\phi^{(2)} - 1) \right\}. \quad \text{Eq. (12)}$$

An example of the resulting sampling points for a first azimuth sector spanning $\phi \in [-90°, 90°]$, i.e., $\Psi = \pi$ and $\Delta_\theta^{(1)} = \Delta_\phi^{(1)} = 15°$, $\Delta_\theta^{(2)} = \Delta_{99}^{(2)} = 60°$, is shown in FIG. 8A.

Second Embodiment

In a second embodiment, shown in FIG. 8B, the elevation grid points for the first and second azimuth sectors are derived as in the first embodiment. However, the azimuth grid points are determined differently, allowing for a sparser grid than in the first embodiment. Particularly, the azimuth step sizes are depending on the elevation $\theta$, allowing for a more evenly distributed sampling grid over the surface of the sphere or wedge thereof.

The azimuth step sizes in the first sector, $\Delta_\phi^{(1)}(\theta), \theta \in S_\theta^{(1)}$ are determined as follows.

To find the number $k^{(1)}(\theta)$ of sample steps $\Delta_\phi^{(1)}(\theta)$ into which $\Psi$ can be divided, while targeting that each sampling point in the first sector is representing similar area regardless of elevation although not identical, one searches the positive integer divisor a that minimizes the difference between $\Psi/a$ and $c^{(1)} \cdot \Delta_\phi^{(1)}/\sin(\theta)$, $$k^{(1)}(\theta)\big|_{\theta \in S_\theta^{(1)}} = \underset{a \in N}{\operatorname{argmin}} \left( \left| \frac{\Psi}{a} - c^{(1)} \cdot \Delta_\phi^{(1)}/\sin(\theta) \right| \right). \quad \text{Eq. (13)}$$

where $\Delta_\phi^{(1)}$ corresponds to the smallest step size to apply and is determined beforehand under the constraint of $\Psi/\Delta_\phi^{(1)} \in N$, i.e., that $\Psi$ shall be possible to represent exactly in a multiple of $\Delta_\phi^{(1)}$. The step size to use for elevation $\theta \in S_\theta^{(1)}$ can be determined through $$\Delta_\phi^{(1)}(\theta) = \frac{\Psi}{k^{(1)}(\theta)}. \quad \text{Eq. (14)}$$

The factor $c^{(1)}$ defined as $$c^{(1)} = \max_{\theta \in S_\theta^{(1)}} \sin(\theta), \quad \text{Eq. (15)}$$

has been introduced in order to yield a smallest step size $\Delta_\phi^{(1)}(\theta) = \Delta_\phi^{(1)}$ for the $\theta \in S_\theta^{(1)}$ that is closest to the elevation point $\theta = 90$ degrees. If instead $c^{(1)} = 1$ is used, only $\Delta_\phi^{(1)}(\pi/2) = \Delta_\phi^{(1)}$ will be fulfilled. For this embodiment either is fine.

Similarly, for the second sector, $$k^{(2)}(\theta)\big|_{\theta \in S_\theta^{(2)}} = \underset{a \in N}{\operatorname{argmin}} \left( \left| \frac{2\pi - \Psi}{a} - c^{(2)} \cdot \Delta_\phi^{(2)}/\sin(\theta) \right| \right). \quad \text{Eq. (16)}$$

$$\Delta_\phi^{(2)}(\theta) = (2\pi - \Psi)/k^{(2)}(\theta). \quad \text{Eq. (17)}$$

$$c^{(2)} = \max_{\theta \in S_\theta^{(2)}} \sin(\theta). \quad \text{Eq. (18)}$$

The sets of azimuth sampling points are determined as $$S_\phi^{(1)}(\theta)\big|_{\theta \in S_\theta^{(1)}} = \left\{ \frac{k+1}{2} \Delta_\phi^{(1)}(\theta), k = 0, 1, \ldots, (\Psi/\Delta_\phi^{(1)}(\theta) - 1) \right\} \quad \text{Eq. (19)}$$

for the first sector, and $$S_\phi^{(2)}(\theta)\big|_{\theta \in S_\theta^{(2)}} = \left\{ \frac{k+1}{2} \Delta_\phi^{(2)}(\theta), k = 0, 1, \ldots, ((2\pi - \Psi)/\Delta_\phi^{(2)}(\theta) - 1) \right\} \quad \text{Eq. (20)}$$

for the second sector.

This embodiment provides an efficient sampling grid for measurement setups where there are no constraints on where measurements can be conducted with respect to $\phi$ and $\theta$. As indicated in Table 1, this embodiment uses the least number of sampling points.

Third Embodiment

In a third embodiment, shown in FIG. 8C, the sampling grid is similarly derived as in the second embodiment but with an additional constraint on only using azimuth positions that are multiples of $\Delta_\phi^{(1)}$ and $\Delta_\phi^{(2)}$ respectively. The reason for such constraint may be that measurement setup does not support measurements that are carried out freely with respect to $\phi$ and $\theta$ or would result in an inefficient execution of the measurements. Particularly, in some test setups, such as the one in FIG. 3A, using azimuth positions that are multiples of $\Delta_\phi^{(1)}$ is beneficial since a rotation of the DUT may introduce inaccuracies. Hence rotating the DUT as few times as possible is desirable. There are many alternatives to obtain a grid where all sampling points are on the raster defined by multiples of $\Delta_\phi^{(1)}$. One of the alternatives is as follows.

To find the number $k^{(1)}(\theta)$ of sample steps $\Delta_\phi^{(1)}(\theta)$ into which $\Psi$ can be divided, while targeting that each sampling point in the first sector is representing similar area regardless of elevation although not identical, and under the constraint that $\Delta_\phi^{(1)}(\theta) = q \cdot \Delta_\phi^{(1)}$, $q \in N$, one searches for the odd positive integer a that minimizes the distance to $c^{(1)}/\sin(\theta)$:

$$k^{(1)}(\theta)\big|_{\theta \in S_\theta^{(1)}} = \underset{\substack{a = 2n+1 \\ n \in Z}}{\operatorname{argmin}} (|a - c^{(1)}/\sin(\theta)|). \quad \text{Eq. (21)}$$

where $$c^{(1)} = \max_{\theta \in S_\theta^{(1)}} \sin(\theta). \quad \text{Eq. (22)}$$

Similar to the previous embodiment, one may use a different $c^{(1)}$, e.g., $c^{(1)} = 1$, by which the switching point with respect to elevation between dense and sparse $\Delta_\phi^{(1)}(\theta)$ changes.

The step size to use for elevation $\theta \in S_\theta^{(1)}$ is determined through:

$$\Delta_\phi^{(1)}(\theta) = \Delta_\phi^{(1)} k^{(1)}(\theta). \quad \text{Eq. (23)}$$

Similarly, for the second sector, the sampling grid step is determined through:

$$k^{(2)}(\theta)\big|_{\theta \in S_\theta^{(2)}} = \underset{\substack{a=2n+1 \\ n \in Z}}{\mathrm{argmin}}(|a - c^{(2)}/\sin(\theta)|), \quad \text{Eq. (24)}$$

$$\Delta_\phi^{(2)}(\theta) = \Delta_\phi^{(2)} k^{(2)}(\theta), \quad \text{Eq. (25)}$$

and where, for instance, $$c^{(2)} = \max_{\theta \in S_\theta^{(2)}} \sin(\theta). \quad \text{Eq. (26)}$$

The sets of azimuth sampling points are determined as:

$$S_\phi^{(1)}(\theta)\big|_{\theta \in S_\theta^{(1)}} = \left\{ \frac{k+1}{2} \Delta_\phi^{(1)}(\theta), k = 0, 1, \ldots, (\Psi/\Delta_\phi^{(1)}(\theta) - 1) \right\} \quad \text{Eq. (27)}$$

for the first sector, and $$S_\phi^{(2)}(\theta)\big|_{\theta \in S_\theta^{(2)}} = \left\{ \frac{k+1}{2} \Delta_\phi^{(2)}(\theta), k = 0, 1, \ldots, ((2\pi - \Psi)/\Delta_\phi^{(2)}(\theta) - 1) \right\} \quad \text{Eq. (28)}$$

for the second sector.

In this embodiment only odd multiples of $\Delta_\phi^{(1)}$ are used, the reason being that the sampling points then can be evenly distributed. Other alternatives are not precluded.

Fourth Embodiment

In a fourth embodiment, measurements are carried out over the first sector, whereas measurements over the second sector are substituted by a constant value, e.g., the sensitivity limit of the measurement equipment or could be assumed pre-fixed to a level well below the strongest signal of interest (e.g., −30 dB).

When estimating whether the TRP data is required for all points, it is proposed to fill in fixed values and thereby reduce the number of actual measurements, especially outside the region of intended radiation.

Fifth Embodiment

If the location of the beam of the wanted signal, i.e., the beam-formed signal achieved by transmitting highly correlated signals from multiple transceivers, is known as should be declared by the vendor of the DUT, the grid can be reduced at the location of the main beam when measuring TRP for unwanted emissions close to the carrier (e.g., ACLR). This grid can be set, based upon knowledge of the Half-Power Beam Width (HPBW) (also known as 3 dB beam width) of the wanted signal and use that grid size knowledge for the remainder sphere outside of the location of the wanted signal. The wanted signal is the carrier of interest and unwanted signal is not just the signal just outside the carrier but also including the spurious emissions. For the operating band unwanted emissions, the sampling grid should be limited to the region of radiation.

Sixth Embodiment

In a further generalization of the disclosure there may be more than two sectors, each with an associated sampling grid density.

Seventh Embodiment

A further extension of the grid embodiments is to ensure one of the grid points is at the beam peak. For example, the grid spacing can be modified or the grid can be translated such that one of the points is on the beam peak.

Eighth Embodiment

Figure 11:
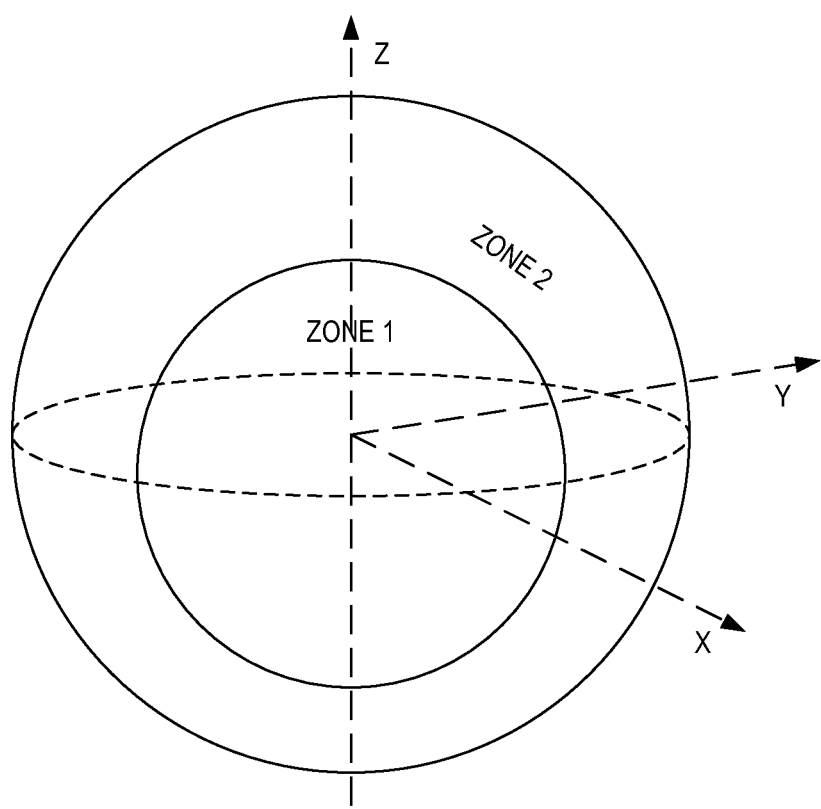
FIG. 11 illustrates a spherical sampling grid with two unequal sampling zones.

In a further generalization of the disclosure, the sampling zones with different sampling grid densities are not constrained to be defined through sectors in the azimuth plane (i.e., as surfaces of spherical wedges), but may be any geometrical shape on the sphere's surface. For instance, a sampling zone may be defined as the surface of a spherical cap or a spherical sector as shown in FIG. 11. Such sampling grid may be particularly useful when conducting measurements of wanted signal from a very narrow beam providing a small cross sectional area in the sphere, e.g., pencil beams. Moreover, a sampling zone may be defined as the surface of a spherical segment, a.k.a. spherical sampling zone. Particularly, if having three sampling zones, two of the sampling zones may constitute the surfaces of spherical caps, and the third may constitute the surface of a spherical segment that is placed between the two spherical caps. Other geometrical shapes are not precluded. FIG. 11: Illustrates two sampling zones, Zone 1 and Zone 2, with individual sampling grids. Zone 1 constitutes the surface of a spherical cap, and Zone 2 is the remaining surface area of the sphere.

Figure 12:
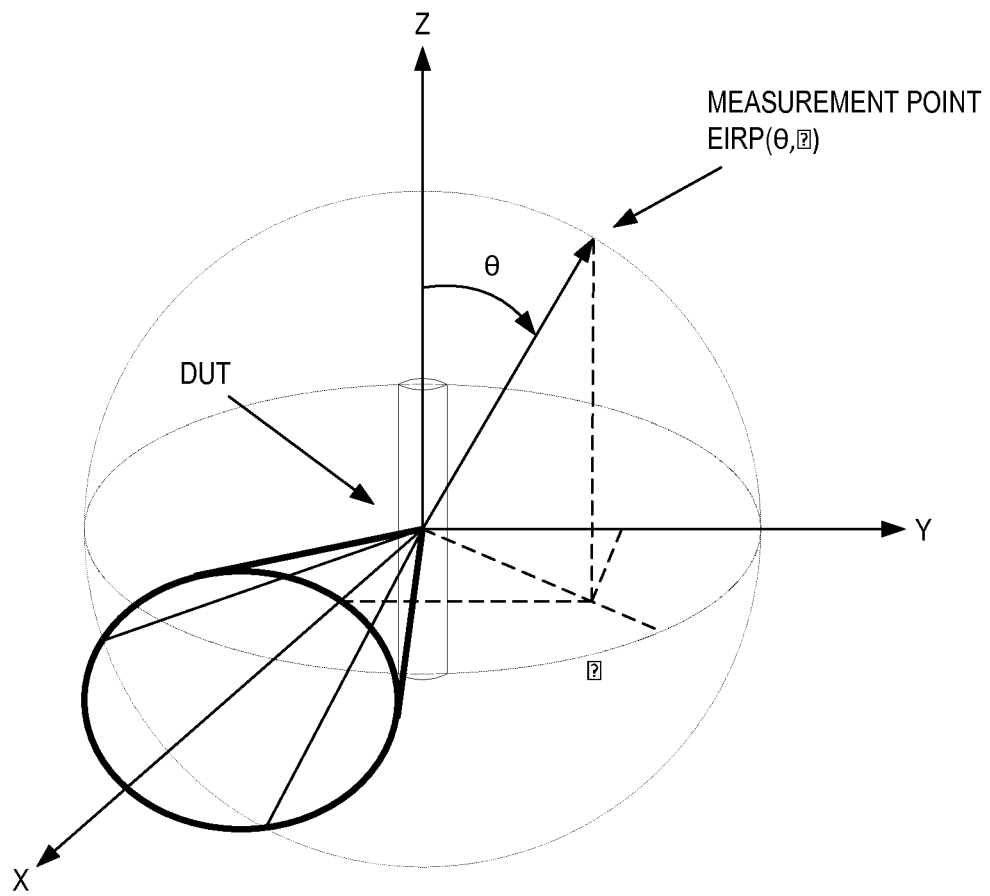
FIG. 12 illustrates a narrow beam in a spherical grid.

In one embodiment, where the wanted signal is beam-formed, a more dense measurement grid is needed, but the regions of the sphere that need to be measured can be reduced based on the coverage area of the beam. FIG. 12 illustrates an example where a single beam is transmitted. The coverage area of the beam, illustrated by a bold cone in FIG. 12 (geometrically equivalent with the spherical cap or sector as shown in FIG. 11), translates to a sampling grid for the coverage area shown in FIG. 13. A low density sampling grid (not shown) is used outside the coverage area of the beam to reduce test time. A simple approach to define the coverage area is to find the peak of beam and consider a subset of the sampling grid in a circle of constant radius (using the peak as the center point). The vendor can declare the region covered by the beam to be measured, or the region can be specified by standards. In one embodiment, the "cone" is defined by a predetermined limit from the beam peak, e.g., 30 dB from the beam peak.

One aspect of the disclosure comprises a method for setting a sampling grid for estimating TRP that is dependent on known or estimated device geometry, beam pattern or directivity. The methods may be implemented as control hardware and software controlling a base station under test and test equipment.

In addition, another aspect of the disclosure comprises an algorithm designed to assist in optimizing the number of measurement samples needed to determine an estimated TRP and thereby controlling test equipment. The algorithm can be implemented in a test environment such as a computer or other test equipment (e.g., a computer controlled test equipment connected together (such as power meters, spectrum analyzers, etc.) that is centrally controlled by the computer system along with the DUT AAS in order to facilitate automated testing of an AAS. Embodiments of the disclosure offer an alternative to full TRP measurement for unwanted emissions requirements of an AAS system.

Figure 14:
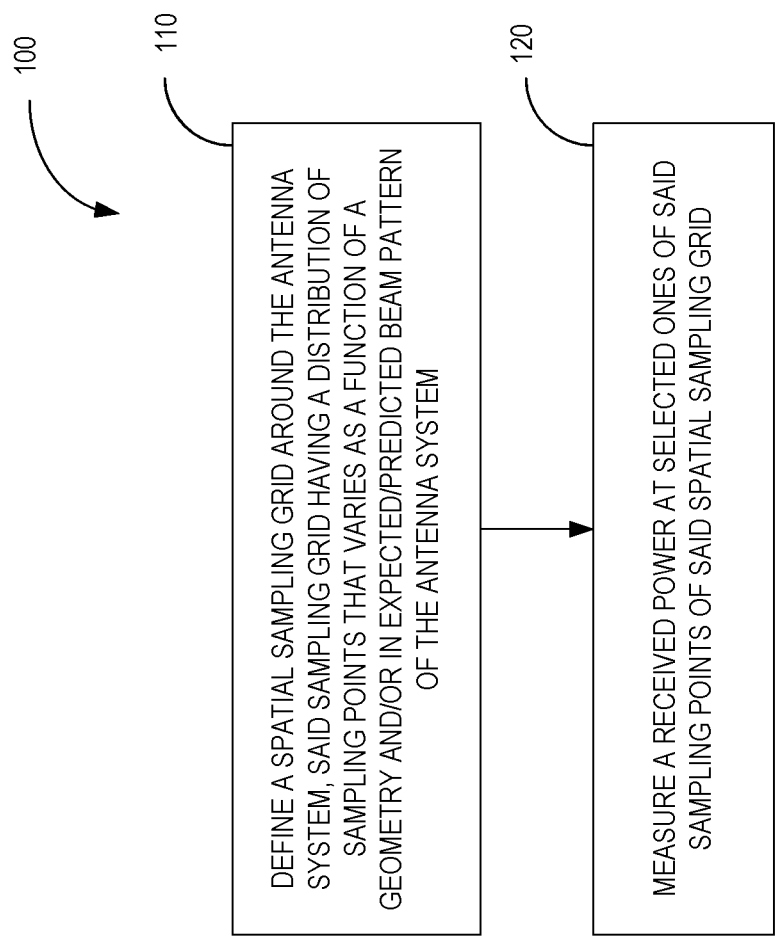
FIG. 14 illustrates an exemplary method of making over-the-air measurements according to one embodiment.

FIG. 14 illustrates an exemplary method 100 according to one embodiment of the disclosure for carrying out OTA measurements of an antenna system using techniques described above. The antenna system may comprise an AAS and/or a directional antenna system in a base station or other network equipment. The method 100 may be performed, for example, by measurement equipment 200 as shown in FIGS. 15-18 including a positioner 210 for positioning the antenna system under test, a test antenna 210 to receive test signals from the antenna system or equipment under test, a control circuit 240 to control the positioner, and a measurement circuit 270 to measure received power of the test signals received from the antenna system. To perform the method, the measurement equipment 200 defines a spatial sampling grid around the antenna system (block 11). The sampling grid has a distribution of sampling points that varies as a function of a geometry of the antenna system and/or as a function of the expected/predicted beam pattern of the antenna system. The measurement equipment 200 measures a received power of test signals transmitted by the antenna system (block 120). The measurements are made at selected ones of the sampling points in said spatial sampling grid.

Figure 15:
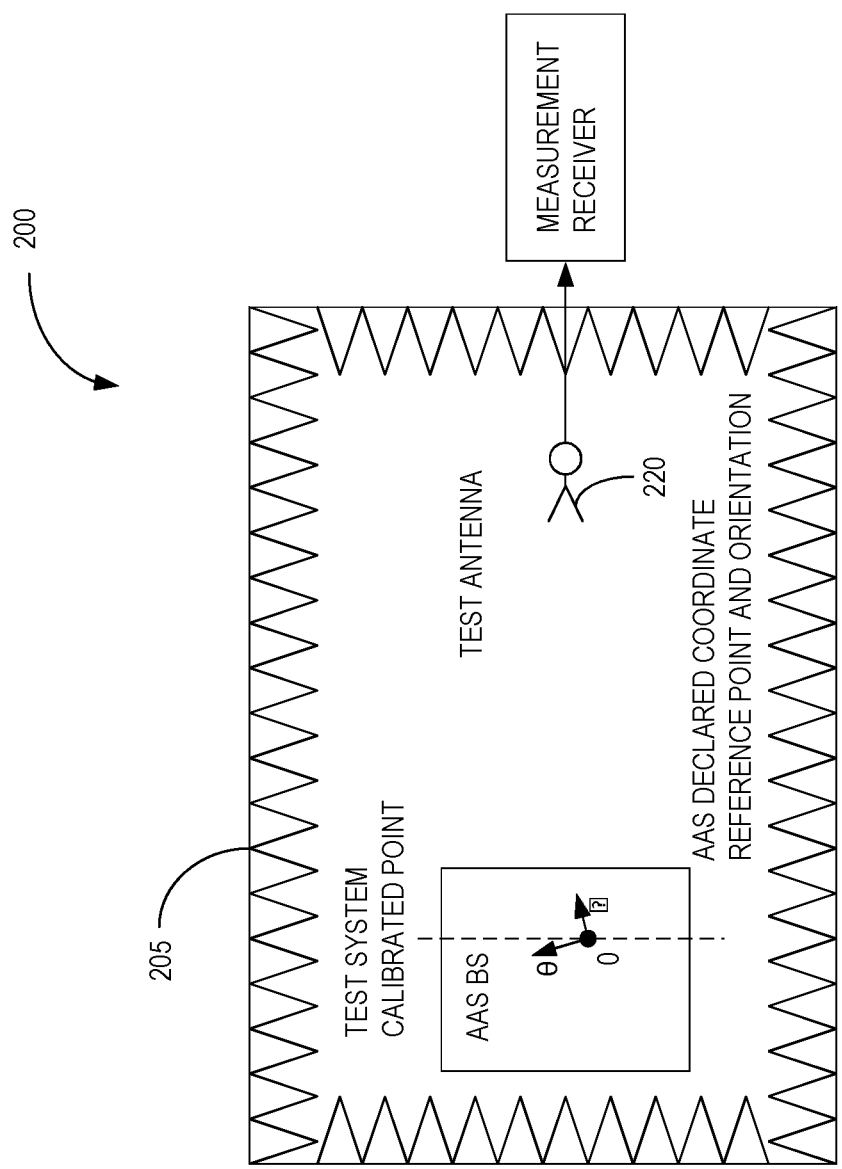
FIG. 15 illustrates an exemplary measurement setup for making over-the-air measurements.

FIG. 15 illustrates an exemplary setup for measuring radiated transmit power from an active antenna system AAS base station (BS). In this setup, the BS equipment is positioned at a coordinate reference point defined by the measurement equipment 200. The AAS BS and the test antenna 220 for the measurement equipment may optionally be enclosed within a test system enclosure 205. Those skilled in the art will appreciate that a test system enclosure is not required by some types of measurement equipment 200. For example, measurements could be made by a near field scanner without a test enclosure.

Figure 16:
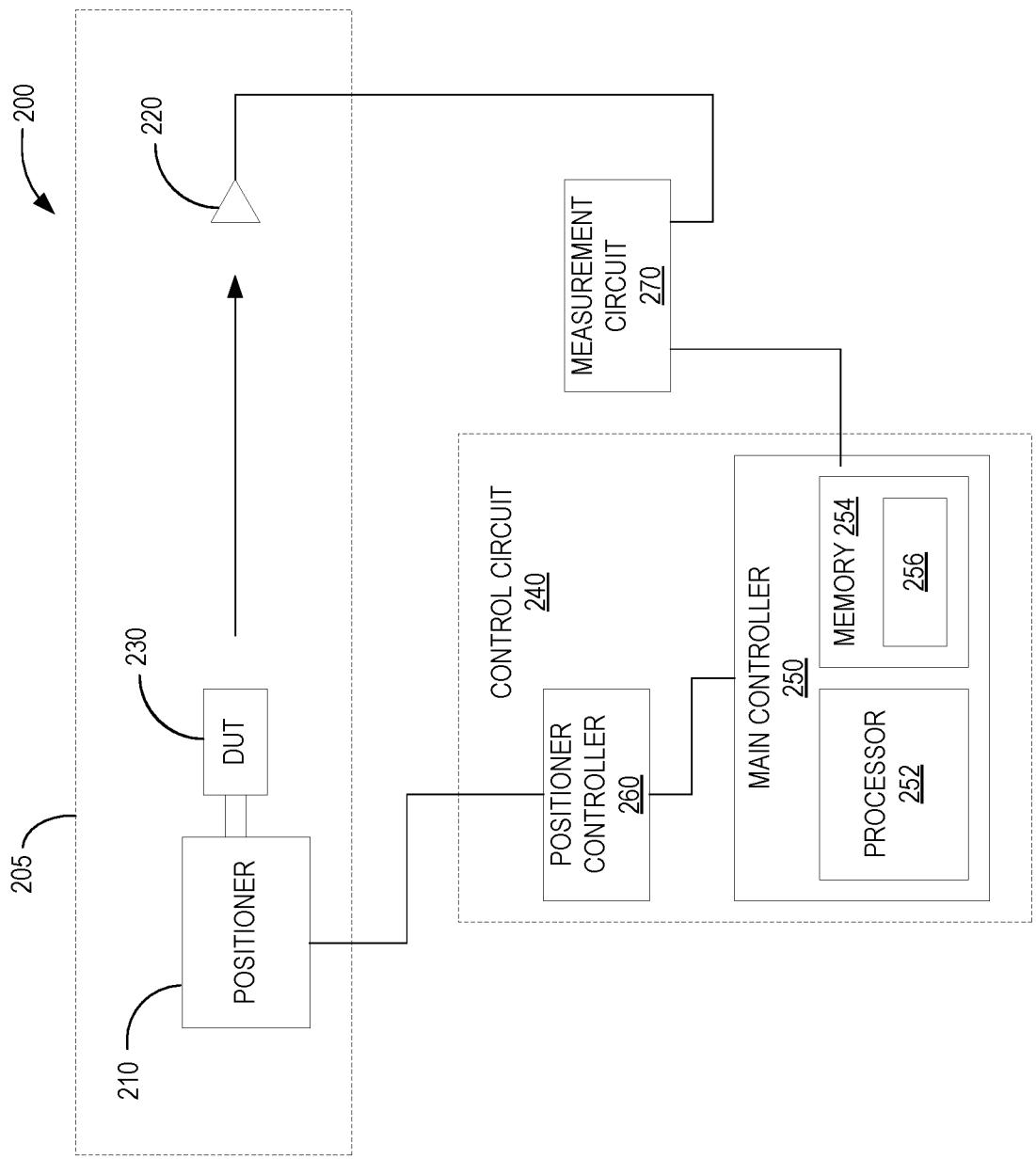
FIG. 16 illustrates measurement equipment according to one embodiment.

FIG. 16 illustrates in more detail the main functional components of the measurement equipment, indicated generally by the numeral 200. The measurement equipment comprises a positioner 210, a test antenna 220, a control circuit 240, and a measurement circuit 270. The positioner 210 may comprise any type of positioner such as a distributed access positioner or combined access positioner as shown in FIG. 3. The purpose of the positioner 210 is to change the relative positions of the antenna system 230 of other equipment under test and the test antenna 220. This may be achieved by changing the position of the antenna system or equipment under test, changing the position of the test antenna 220, or both. The test antenna 220 receives test signal transmitted by the antenna system 230 or other DUT. The received signals are input to the measurement circuit 270 to measure the receive power of the test signals.

The control circuit 240 controls the operation of the measurement equipment 200. The control circuit 240 may comprise one or more computers, processors, hardware circuits, application specific integrated circuits, firmware, or a combination thereof. The main components of the control circuit 240 include a main controller 250 and a positioner controller 260.

The main controller 250 defines a spatial sampling grid for performing measurements of receive power from the antenna system 230 or other DUT. In one exemplary embodiment, the distribution of the sampling points in the sampling grid varies depending on the geometry of the test equipment and/or the direction of signals emitted by the antenna system 230 or DUT. For example, the main controller 250 may divide the sampling grid into two or more sampling zones where the distribution varies in each of said sampling zones.

The main controller 250 may comprise a processor 252 and associated memory 254 for storing a computer program 256 comprising executable instructions that configure the main controller 250. The instructions, when executed by the processor 252, cause the main controller 250 to operate as herein described. In general, computer program instructions and configuration information are stored in a non-volatile memory, such as a read only memory (ROM), erasable programmable read only memory (EPROM) or flash memory. Temporary data generated during operation may be stored in a volatile memory, such as a random access memory (RAM). In some embodiments, computer program for configuring the main controller 250 as herein described may be stored in a removable memory, such as a portable compact disc, portable digital video disc, or other removable media. The computer program 256 may also be embodied in a carrier such as an electronic signal, optical signal, radio signal, or computer readable storage medium. The main controller may, for example, be implemented by a stand-alone computer.

The positioner controller 260, which may be connected to or integrated with the main controller 250, controls the positioner 210 to change the relative position of the antenna system 230 or DUT and the test antenna 220 by changing the position of the antenna system 230 or DUT, changing the position of the test antenna 220, or both. The main controller 260 provides positioning signals to the positioner controller 260 representing the sampling points at which measurements are to be made. Responsive to the positioning signals from the main controller 250, the positioning controller 250 generates control signals that control the positioner 210. Responsive to the control signals, the positioner 210 changes the relative position of the antenna system 230 or DUT and the test antenna 220 by changing the position of the equipment under test, changing the position of the test antenna, or both. The positioner 210 and test antenna 220 may optionally be enclosed within a test enclosure 205, such as an anechoic chamber, for a compact test range (CATR).

Once the antenna system 230 or DUT is positioned by the positioner 210, the main controller 250 instructs the antenna system 230 or DUT to transmit a test signal. The test signal is received by the test antenna 220 and input to the measurement circuit 270 to perform a receive power measurement. The receive power measurement is input to the man controller 250 which may use the receive power measurement to calculate the TRP and/or ACLR of the antenna system.

Figure 17:
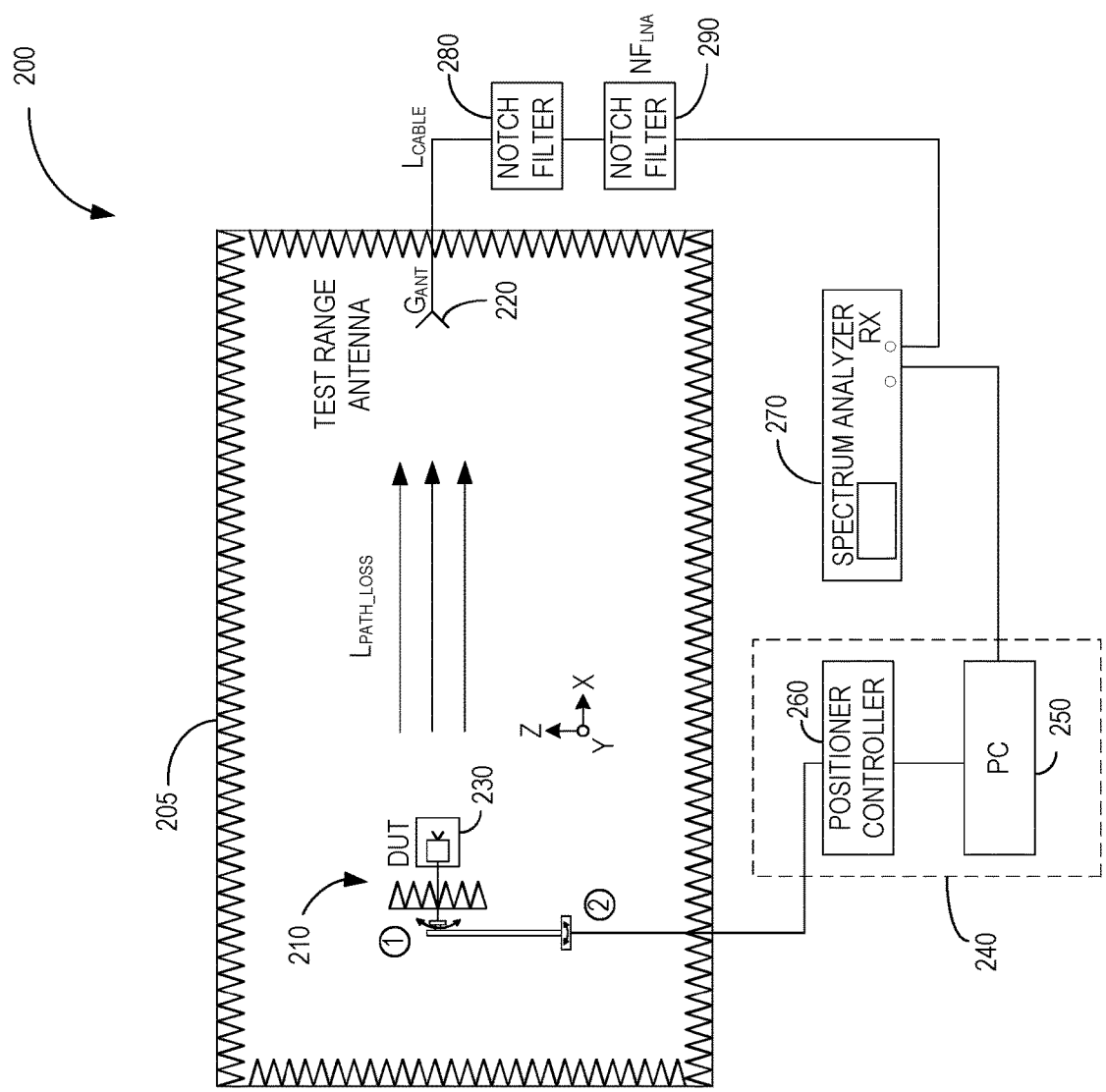
FIG. 17 illustrates measurement equipment according to another embodiment.
Figure 18:
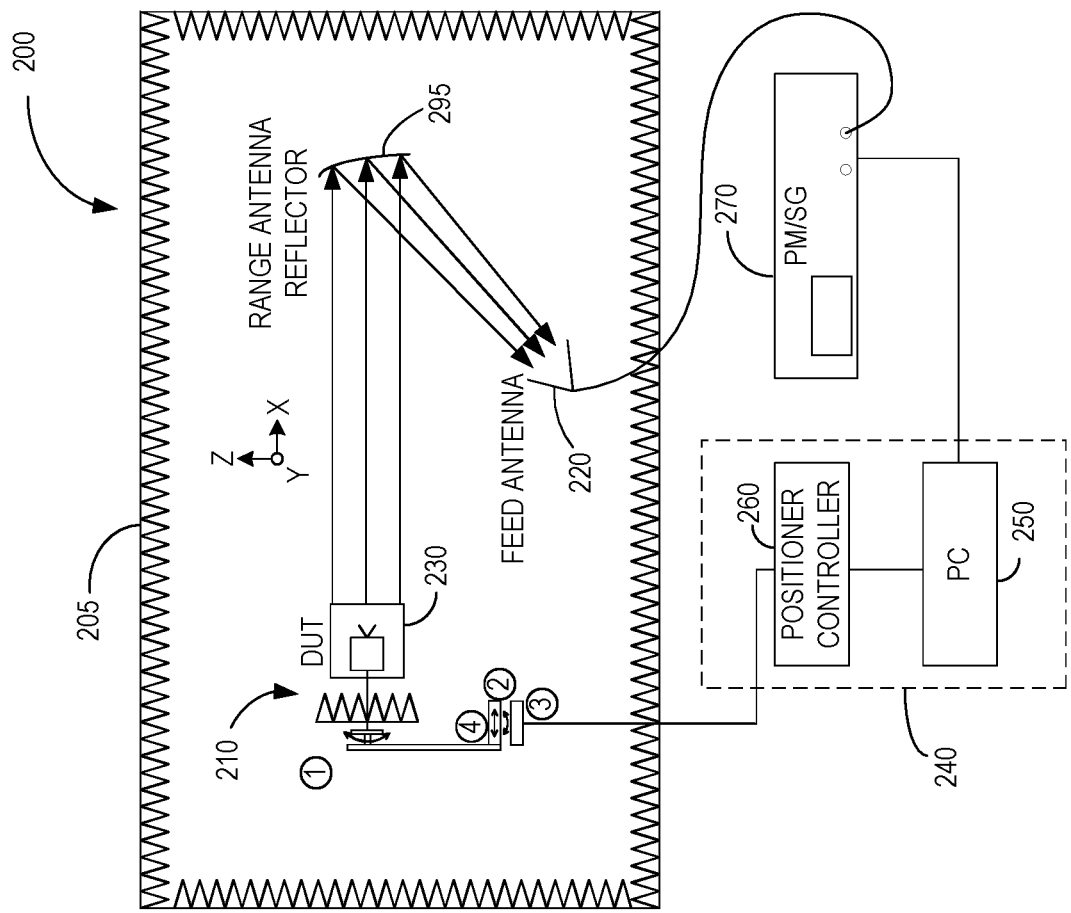
FIG. 18 illustrates measurement equipment according to another embodiment.

FIGS. 17 and 18 illustrate other embodiments of measurement equipment that may be used to perform measurements as herein described. For simplicity, FIGS. 17 and 18 use similar reference numerals as FIG. 16 to indicate similar components. The embodiment shown in FIG. 17 includes a positioner 210, a test antenna 220, a control circuit 240, and a measurement circuit 270 as previously described. The positioner 210 and test antenna 220 are enclosed within a test enclosure 205, such as an anechoic chamber, to form a CATR. The measurement circuit 270 in this embodiment comprises a spectrum analyzer. A notch filter 280 and low noise amplifier (LNA) 290 are disposed along the line connecting the test antenna 220 to the measurement circuit 270 to allow frequencies not being measured to be filtered and amplified.

FIG. 18 illustrates another embodiment of the measurement equipment 200. The embodiment shown in FIG. 18 includes a positioner 210, a test antenna 220, a control circuit 240, and a measurement circuit 270. The measurement equipment 200 further includes a range antenna reflector 295 that reflects test signals to the test antenna 220. The positioner 210 and test antenna 220 are enclosed within a test enclosure 205, such as an anechoic chamber, to form a CATR. This embodiment is similar to the CATR described in Third Generation Partnership Project (3GPP) specification TR 37.842, section 10.3.1.1.3, which provides further details.

The TRP measurement techniques and apparatus described herein may be used to measure ACLR for an AAS or non-AAS base station. ACLR is a figure of merit that describes the maximum allowable spectral regrowth in the adjacent channel at the radio frequency (RF) connector, which is attributed to nonlinearities in the transceiver array. The main contributor to ACLR is third order nonlinearity distortion. Traditionally ACLR has been defined as the ratio of power in a given bandwidth at a certain offset in the lower or upper adjacent channel to the power in the desired signal channel. ACLR as:

$$ACLR = \frac{\int_{f_c+f_0}^{f_c+f_0+B} S(f)df}{\int_{f_c-\frac{B}{2}}^{f_c+\frac{B}{2}} S(f)df}, \qquad \text{Eq. (29)}$$

where S(f) is the power spectral density including both emission and desired signal, fc is the carrier frequency, B is the channel bandwidth and f0 is the offset frequency around which the adjacent channel power is integrated.

TRP is defined as:

$$TRP(f) = \frac{1}{4\pi} \int_{\theta=0}^{\pi} \int_{\phi=0}^{2\pi} EIRP(\theta, \phi, f)\sin(\theta)d\theta d\phi \qquad \text{Eq. (30)}$$

$$EIRP(\theta, \phi, f) = EIRP_{p1}(\theta, \phi, f) + EIRP_{p2}(\theta, \phi, f), \qquad \text{Eq. (31)}$$

where $EIRP_{p1}$ and $EIRP_{p2}$ is associated to two orthogonal polarizations.

The consequence is that spatial ACLR is a ratio between two triple integrals over frequency and two spatial angles. The complete mathematical expression for spatial ACLR can be expressed as:

$$ACLR_{spatial} = \frac{\int_{f_c+f_0}^{f_c+f_0+B} \int_{\theta=0}^{\pi} \int_{\phi=0}^{2\pi} \left( \begin{array}{c} EIRP_{p1}(\theta, \phi, f) + \\ EIRP_{p2}(\theta, \phi, f) \end{array} \right) \sin(\theta) d\theta d\phi df}{\int_{f_c-\frac{B}{2}}^{f_c+\frac{B}{2}} \int_{\theta=0}^{\pi} \int_{\phi=0}^{2\pi} \left( \begin{array}{c} EIRP_{p1}(\theta, \phi, f) + \\ EIRP_{p2}(\theta, \phi, f) \end{array} \right) \sin(\theta) d\theta d\phi df} \qquad \text{Eq. (32)}$$

Even though the mathematical expression for spatial ACLR is complex, the frequency domain can easily be handled by introducing total EIRP per channel bandwidth B for the desired signal and the emission.

In an OTA test facility, the power meter is replaced or complemented with a spectrum analyzer. Modern spectrum analyzers can measure the channel power for the desired signal and emission in the neighboring channel simultaneously in real time as shown as an example in FIG. 17.

By introducing $TRP_e$ as the power on the emission within the neighbor channel and $TRP_d$ as the power of the desired signal, the spatial ACLR can therefore be defined as the ratio between $TRP_e$ and $TRP_d$:

$$ACLR_{spatial} = \frac{TRP_e}{TRP_d} \qquad \text{Eq. (33)}$$

It is expected that the radiated power from the desired signal is concentrated to a direction per declaration of a specific beam, while emission in the neighbor channels tends to be spread out spatially, but could potentially also have some beam-forming depending on how correlated the emissions are. $TRP_e$ and $TRP_d$ may be calculated from EIRP($\theta$, $\phi$,f) samples measured in an anechoic chamber.

From theory, TRP can be approximated by sampling total EIRP over the sphere using full-sphere uniform sampling, orthogonal axis sampling, or constant area sampling as previously described. The number of spatial samples will determine the total time required to measure spatial ACLR in an anechoic chamber. The sampling grid resolution will determine the systematic error compared to the true TRP based on knowledge of directivity.

From antenna theory it is known that the EIRP sampling grid resolution used to calculate TRP maintaining a certain systematic error depends on the spatial characteristics of the signal to be observed from the test object. For spatial ACLR, this means that the sampling grid resolution for the desired signal ($TRP_d$) and for the neighbor channel noise ($TRP_e$) should be considered separately. It is reasonable to assume that different sampling grid resolutions are required for the desired signal and the emission where the spatial characteristics are different.

Figure 13:
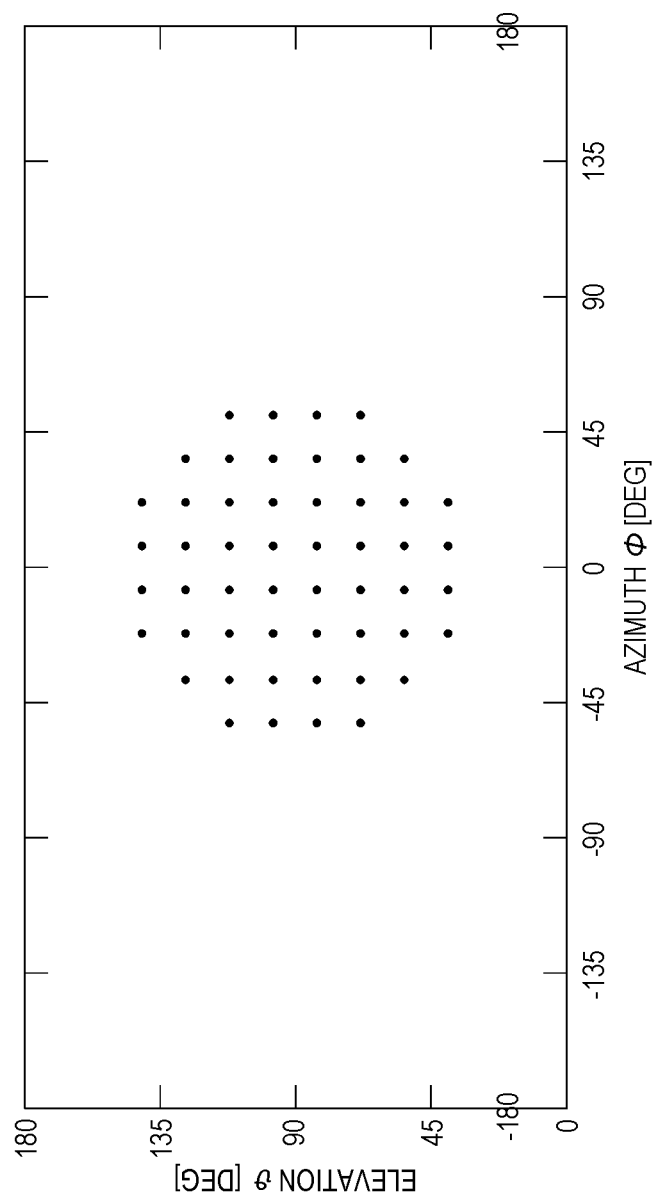
FIG. 13 illustrates a sampling grid for the narrow beam shown in FIG. 12.

For AAS base stations with antenna arrays that direct the beam within a specific coverage area (e.g., +/−90 degrees in azimuth domain and +/−60 degrees in the elevation), EIRP samples outside the intended coverage region is very low. The coverage area of a beam is visualized in FIG. 12. Inside the cone of the beam, EIRP samples as shown in FIG. 13 must be measured, while samples outside the cone can be set to a fixed pre-determined EIRP level to conserve test time. More ideas on how to reduce the number of required EIRP samples is described in a companion contribution as described in the 3GPP contribution R4-168304, "On TRP sampling grid for spatial ACLR", RAN4#80bis. If a beam is sampled with a too sparse grid, power will be lost, hence the measurement error increases. However, a narrow beam could be measured with small errors by aligning the sampling grid with the peak of the narrow beam. For spatial ACLR, the grid could be set so the power of the desired signal is captured using a rather large sampling grid resolution, still maintaining the measurement uncertainty.

Intended radiation associated to the half-sphere corresponding to the backside of the AAS base station is typically suppressed 30 dB or more with respect to maximum radiated power in the front direction. This means that angles corresponding to the backside of the base station could be fixed to a specified value for desired signal power and neighbor channel emission power and therefore not measured.

Figure 19:
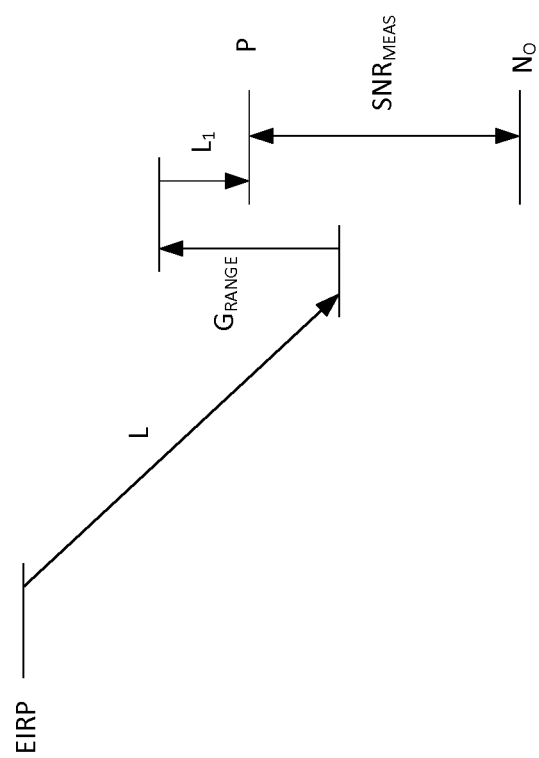
FIG. 19 illustrates path loss the path-loss in a compact antenna test range.

Since spatial ACLR is computed from $TRP_d$ and $TRP_e$, it is important to analyze the measurement uncertainty related to spatial EIRP samples required to calculate $TRP_d$ and $TRP_e$. One approach is to consider the signal-to-noise ratio (SNR) at the measurement receiver (in this case a spectrum analyzer). Assuming a test object where the radiated beam power is 60 dBm EIRP, the path-loss (L-$G_{range}$+L1) in a compact antenna test range can be assumed to be 50 dB, according to FIG. 19, where L is the propagation loss, $G_{range}$ is the range antenna gain, $L_1$ is the range antenna feed loss, $N_o$ is the measurement receiver noise level, $SNR_{MEAS}$ is the measured signal to noise ratio, and P is the power level.

For an EIRP sample at the beam peak of the desired signal, the power at the measurement receiver within the channel bandwidth is 10 dBm. Also, if the emission level is 45 dB below the wanted signal, it would correspond to an EIRP sample corresponding to a neighboring channel to be at −35 dBm at the measurement receiver. It can be noted that the path-loss in the antenna test range approximately corresponds to the attenuator value used measuring conducted ACLR using a spectrum analyzer. Some margin in the link budget is required to allow for the case where emission is non-correlated.

For some spatial sample points the measured emission signal is not determined by the emission due to the test object. Instead, the noise floor of the measurement receiver will be recorded. As long as the measurement receiver noise floor is well below the expected emission level, it will not affect the measurement uncertainty.

Spatial ACLR can be measured in an anechoic chamber (e.g., CATR) using a spectrum analyzer as shown in FIG. 17. Using a spectrum analyzer allows $EIRP_d$ and $EIRP_e$ to be measured at the same time for each sampling point ($\theta$, $\varphi$) and polarization.

Figure 20:
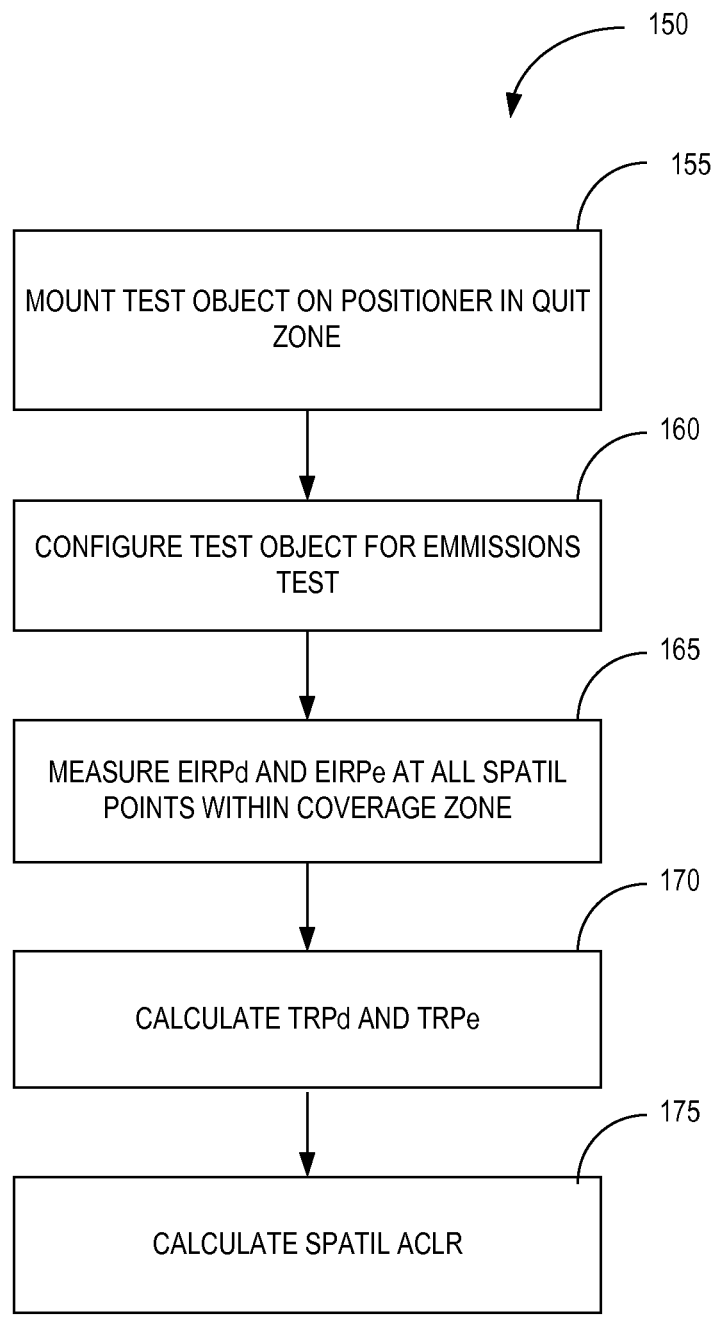
FIG. 20 illustrates a method of measuring Adjacent Channel Leakage Ratio (ACLR).

FIG. 20 illustrates a method 150 for measuring $EIRP_d$ ($\theta$, $\varphi$) and $EIRP_e$ ($\theta$, $\varphi$) using a spectrum analyzer. Because the $EIRP_d$ ($\theta$, $\varphi$) is measured together with $EIRP_e$ ($\theta$, $\varphi$) using a spectrum analyzer, the sampling grid resolution should be determined in a way that $TRP_d$ is captured correctly. The test object (e.g., BS) is mounted on the positioner 210 in the quiet zone of the anechoic chamber (block 155). The test object is configured to generate and transmit the test signals (block 160). During the test, total $EIRP_d$ and $EIRP_e$ are measured at all spatial points within the coverage region of the test beam (block 165). At each spatial point, $EIRP_d$ and $EIRP_e$ for the desired and neighbor emissions are measured per polarization as noted in Equation 31. The $EIRP_d$ and $EIRP_e$ measurements are then used to calculate ACLR. More specifically, the $EIRP_d$ and $EIRP_e$ measurements are used to calculate $TRP_d$ and $TRP_e$, which in turn are used to calculate spatial ACLR according to Equation 33 (blocks 170, 175).

The present disclosure describes methods and apparatus for measuring emissions of an antenna that reduces the number of measurements while maintaining reasonable accuracy. Reducing the number of measurements using the techniques herein described will result in significant reductions in test time.

The invention claimed is:

1. A method for making over-the-air measurements of an antenna system, the method comprising:
defining at least one spatial sampling grid around the antenna system, wherein:
the sampling grid is divided into two or more sampling zones including a front sector and a back sector;
the distribution of sampling points varies in different ones of the sampling zones;
the back sector of the sampling grid has a sparser distribution of sampling points than the front sector; and
measuring a received power at selected ones of the sampling points of the spatial sampling grid.

2. The method of claim 1, further comprising determining a total received power based on the received power measurements.

3. The method of claim 1, wherein the distribution of sampling points varies in different ones of the sampling zones as a function of a geometry of the antenna system.

4. The method of claim 1, wherein the sampling grid is divided into more than two sampling zones.

5. The method of claim 1, wherein the measuring the received power at selected ones of the sampling points of the spatial sampling grid comprises:
measuring received power at sampling points in a first one of the sampling zones; and
substituting a constant value for measurements over a second sampling zone.

6. The method of claim 5, wherein the constant value is determined based on a sensitivity limit of measurement equipment used to perform the measurements.

7. The method of claim 5, wherein the constant value is determined based on measurements in the front sector of the sampling grid and a front-to-back ratio relating measurements in the front sector to an expected received power in the back sector.

8. The method of claim 1, wherein azimuth step sizes between sampling points in the sampling grid are dependent on the elevation of the sampling points.

9. The method of claim 1, wherein defining a spatial sampling grid around the antenna system comprises constraining spatial positions of the sampling points in the spatial sampling grid based on limitations imposed by the measuring equipment.

10. The method of claim 9, wherein azimuth positions of the sampling points in the spatial sampling gird are constrained to multiples of a predetermined azimuth step size.

11. The method of claim 1, wherein a density of sampling points is increased at a location of a main beam emitted from the antenna system when measuring total received power of unwanted emissions close to a main carrier.

12. The method of claim 1, wherein a first sampling zone of the sampling grid is defined as a surface of a spherical cap or a spherical sector.

13. The method of claim 12, wherein the first sampling zone has a specified sampling grid density enabling a denser or sparser grid depending on a direction and beam width of a narrow beam of the antenna system.

14. The method of claim 1, further comprising, defining first and second sampling grids.

15. The method of claim 14:
wherein the first sampling grid is adapted for measuring total radiated power of a desired signal; and
wherein the second sampling grid is adapted to measure total radiated power of spurious or unwanted emissions signals.

16. The method of claim 14:
wherein the first sampling grid is adapted for measuring total radiated power of a desired signal; and
wherein the second sampling grid is adapted to measure total radiated power.

17. The method of claim 14:
wherein the first sampling grid is adapted for measuring total radiated power of a desired signal; and wherein the second sampling grid is adapted to measure total radiated power of unwanted emissions on a neighbor frequency.

18. The method of claim 17, further comprising calculating an Adjacent Channel Leakage Ratio based on the total radiated power of the desired signal and the total radiated power of the unwanted emissions on the neighbor frequency.

19. The method of claim 1, wherein the distribution of sampling points varies in different ones of the sampling zones as a function of a beam pattern or radiation pattern of the antenna system.

20. A measuring equipment for over-the-air measurements of radiated power emitted by a directional antenna system, the measurement equipment comprising:
   a test antenna to receive test signals transmitted by the directional antenna system;
   a measurement circuit to measure received power of the test signals received by the test antenna;
   a positioner for changing the relative positions of the directional antenna system and the test antenna; and
   a control circuit configured to:
      define a spatial sampling grid around the directional antenna system, wherein:
         the sampling grid is divided into two or more sampling zones, including a front sector and a back sector,
         the distribution of sampling points varies in different ones of the sampling zones;
         the back sector of the sampling grid has a sparser distribution of sampling points than the front sector;
      control the positioner to position the test antenna relative to the directional antenna system at sampling points in the spatial sampling grid; and
      control the measurement circuit to measure received power at sampling points in the spatial sampling grid.

21. A non-transitory computer-readable storage medium storing a computer program product for controlling measuring equipment for measuring received power of an antenna system for making over-the-air measurements of the antenna system, the computer program product comprising software instructions which, when run on processing circuitry of the measurement equipment, causes the measurement equipment to:
   define at least one spatial sampling grid around the antenna system, wherein:
      the sampling grid having two or more sampling zones including a front sector and a back sector;
      the distribution of sampling points varies in different ones of the sampling zones;
      the back sector of the sampling grid has a sparser distribution of sampling points than the front sector; and
   measure a received power at selected ones of the sampling points of the spatial sampling grid.

* * * * *

UNITED STATES PATENT AND TRADEMARK OFFICE
CERTIFICATE OF CORRECTION

PATENT NO. : 10,784,972 B2
APPLICATION NO. : 16/336554
DATED : September 22, 2020
INVENTOR(S) : Axmon et al.

It is certified that error appears in the above-identified patent and that said Letters Patent is hereby corrected as shown below:

In the Specification

In Column 2, Line 55, delete "measurements grids" and insert -- sampling grids --, therefor.

In Column 2, Line 58, delete "measurements grids" and insert -- sampling grids --, therefor.

In Column 3, Line 54, delete "grid. with" and insert -- grid with --, therefor.

In Column 5, Line 33, delete "FIGS 5A 5D." and insert -- FIGS 5A-5D. --, therefor.

In Column 6, Line 60, delete "depending of" and insert -- depending on --, therefor.

In Column 7, Line 50, delete "$\Delta\varphi 1/16$ degree," and insert -- $\Delta\varphi=1/16$ degree, --, therefor.

In Column 8, Line 50, delete "in the" and insert -- is used in the --, therefor.

In Column 9, Line 9, Equation (12), delete
"$S_\phi^{(2)} = \{\frac{k+1}{2}\Delta_\phi^{(2)}, k = 0, 1, \ldots, ((2\pi - \Psi/\Delta_\phi^{(2)} - 1)\}.$" and insert
-- $S_\phi^{(2)} = \{\frac{k+1}{2}\Delta_\phi^{(2)}, k = 0, 1, \ldots, ((2\pi - \Psi)/\Delta_\phi^{(2)} - 1)\}.$ --, therefor.

In Column 9, Line 14, delete "$\Delta_\theta^{(2)}=\Delta_{99}^{(2)}=60°$," and insert -- $\Delta_\theta^{(2)}=\Delta_\phi^{(2)}=60°$, --, therefor.

In Column 9, Line 29, delete "$k^{(1)}$ ($\theta$)of sample steps $\Delta_\phi^{(1)}$ ($\theta$)into" and insert -- $k^{(1)}$ ($\theta$) of sample steps $\Delta_\phi^{(1)}$ ($\theta$) into --, therefor.

In Column 10, Line 33, delete "$\Delta_\phi^{(2)}$respectively." and insert -- $\Delta_\phi^{(2)}$ respectively. --, therefor.

Signed and Sealed this
Eighth Day of June, 2021

Drew Hirshfeld
*Performing the Functions and Duties of the
Under Secretary of Commerce for Intellectual Property and
Director of the United States Patent and Trademark Office*

In Column 10, Line 54, Equation (21), delete

"$$k^{(1)}(\theta)\big|_{\theta \in S_\theta^{(1)}} = \underset{\substack{a=2n+1 \\ n \in Z}}{\operatorname{argmin}}(|(a - c^{(1)}/\sin(\theta)|).$$" and insert -- $$k^{(1)}(\theta)\big|_{\theta \in S_\theta^{(1)}} = \underset{\substack{a=2n+1 \\ n \in Z}}{\operatorname{argmin}}(|a - c^{(1)}/\sin(\theta)|),$$ --, therefor.

In Column 13, Line 13, delete "test antenna 210" and insert -- test antenna 220 --, therefor.

In Column 13, Line 19, delete "(block 11)." and insert -- (block 110). --, therefor.

In Column 14, Lines 29-30, delete "main controller 260" and insert -- main controller 250 --, therefor.